US012796347B2

(12) United States Patent
Furuta et al.

(10) Patent No.: US 12,796,347 B2
(45) Date of Patent: Nov. 10, 2026

(54) MANUFACTURING METHOD OF SUBSTRATE UNIT, AND SUBSTRATE UNIT

(71) Applicant: Oki Electric Industry Co., Ltd., Tokyo (JP)

(72) Inventors: Hironori Furuta, Tokyo (JP); Toru Kosaka, Tokyo (JP); Takahiro Ida, Tokyo (JP); Takuma Ishikawa, Tokyo (JP); Kenichi Tanigawa, Tokyo (JP); Takahito Suzuki, Tokyo (JP); Yutaka Kitajima, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 211 days.

(21) Appl. No.: 18/417,365

(22) Filed: Jan. 19, 2024

(65) Prior Publication Data

US 2024/0332080 A1 Oct. 3, 2024

(30) Foreign Application Priority Data

Mar. 28, 2023 (JP) ................................ 2023-051481

(51) Int. Cl.

| | |
|---|---|
| ***H10P 14/20*** | (2026.01) |
| ***H10P 90/00*** | (2026.01) |
| ***H10P 95/00*** | (2026.01) |
| ***H10W 10/00*** | (2026.01) |
| ***H10W 10/10*** | (2026.01) |

(52) U.S. Cl.

CPC .......... *H10P 14/2924* (2026.01); *H10P 14/32* (2026.01); *H10P 90/1906* (2026.01); *H10P 95/11* (2026.01); *H10P 95/112* (2026.01); *H10W 10/061* (2026.01); *H10W 10/181* (2026.01)

(58) Field of Classification Search

None

See application file for complete search history.

(56) References Cited

U.S. PATENT DOCUMENTS

| | | | | |
|---|---|---|---|---|
| 8,895,406 | B2 | 11/2014 | Rogers et al. | |
| 2017/0110314 | A1 | 4/2017 | Odnoblyudov et al. | |
| 2017/0117441 | A1* | 4/2017 | Tsukihara | H10H 20/825 |
| 2019/0123249 | A1 | 4/2019 | Hirano et al. | |
| 2022/0230920 | A1* | 7/2022 | Hiza | H01L 21/0254 |
| 2022/0359273 | A1* | 11/2022 | Wu | H01L 21/32137 |

FOREIGN PATENT DOCUMENTS

| | | | |
|---|---|---|---|
| JP | 2005-019590 | A | 1/2005 |
| TW | 201413833 | A | 4/2014 |
| TW | 201914050 | A | 4/2019 |
| WO | 2008044381 | A1 | 4/2008 |

OTHER PUBLICATIONS

Office Action issued for corresponding European patent application No. 24153031.0 dated Apr. 10, 2026.

* cited by examiner

*Primary Examiner* — Jiong-Ping Lu

(74) *Attorney, Agent, or Firm* — Rabin & Berdo, P.C

(57) ABSTRACT

A manufacturing method of a substrate unit includes forming a semiconductor laminated body on a substrate; forming a sacrificial layer on the semiconductor laminated body; forming a semiconductor functional layer on the sacrificial layer; and forming a protective film that covers at least a back surface of the substrate different from a formation surface on which the semiconductor laminated body is formed, a side face of the substrate, and a side face of the semiconductor laminated body.

4 Claims, 21 Drawing Sheets

MANUFACTURING METHOD OF SUBSTRATE UNIT, AND SUBSTRATE UNIT

BACKGROUND OF THE INVENTION

1. Field of the Invention

The present disclosure relates to a manufacturing method of a substrate unit and to a substrate unit.

2. Description of the Related Art

There has been proposed a technology regarding a manufacturing method of a semiconductor device that makes it possible to reuse a substrate for the crystal growth of a semiconductor thin film as a semiconductor functional layer (see Patent Reference 1, for example).

Patent Reference 1 is Japanese Patent Application Publication No. 2005-019590 (see paragraphs 0030 and 0040, for example).

However, damage to the substrate in an etching process cannot be prevented adequately by just protecting the substrate's crystal growth surface as in the aforementioned conventional technology. Therefore, a multilayer substrate including the substrate and a semiconductor laminated body formed on the substrate cannot be reused for the crystal growth of the next semiconductor functional layer in many cases.

SUMMARY OF THE INVENTION

An object of the present disclosure is to provide a manufacturing method of a substrate unit and a substrate unit capable of reducing damage to a substrate for the growth of a semiconductor functional layer.

A manufacturing method of a substrate unit according to the present disclosure, includes forming a semiconductor laminated body on a substrate; forming a sacrificial layer on the semiconductor laminated body; forming a semiconductor functional layer on the sacrificial layer; and forming a protective film that covers at least a back surface of the substrate different from a formation surface on which the semiconductor laminated body is formed, a side face of the substrate, and a side face of the semiconductor laminated body.

A substrate unit according to the present disclosure, includes a substrate; a semiconductor laminated body formed on the substrate; and a protective film that covers at least a back surface of the substrate different from a formation surface on which the semiconductor laminated body is formed, a side face of the substrate, and a side face of the semiconductor laminated body.

According to the present disclosure, the damage to the substrate for the growth of the semiconductor functional layer can be reduced and the number of times of reusing the substrate and the semiconductor laminated body can be increased.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

Figure 2:
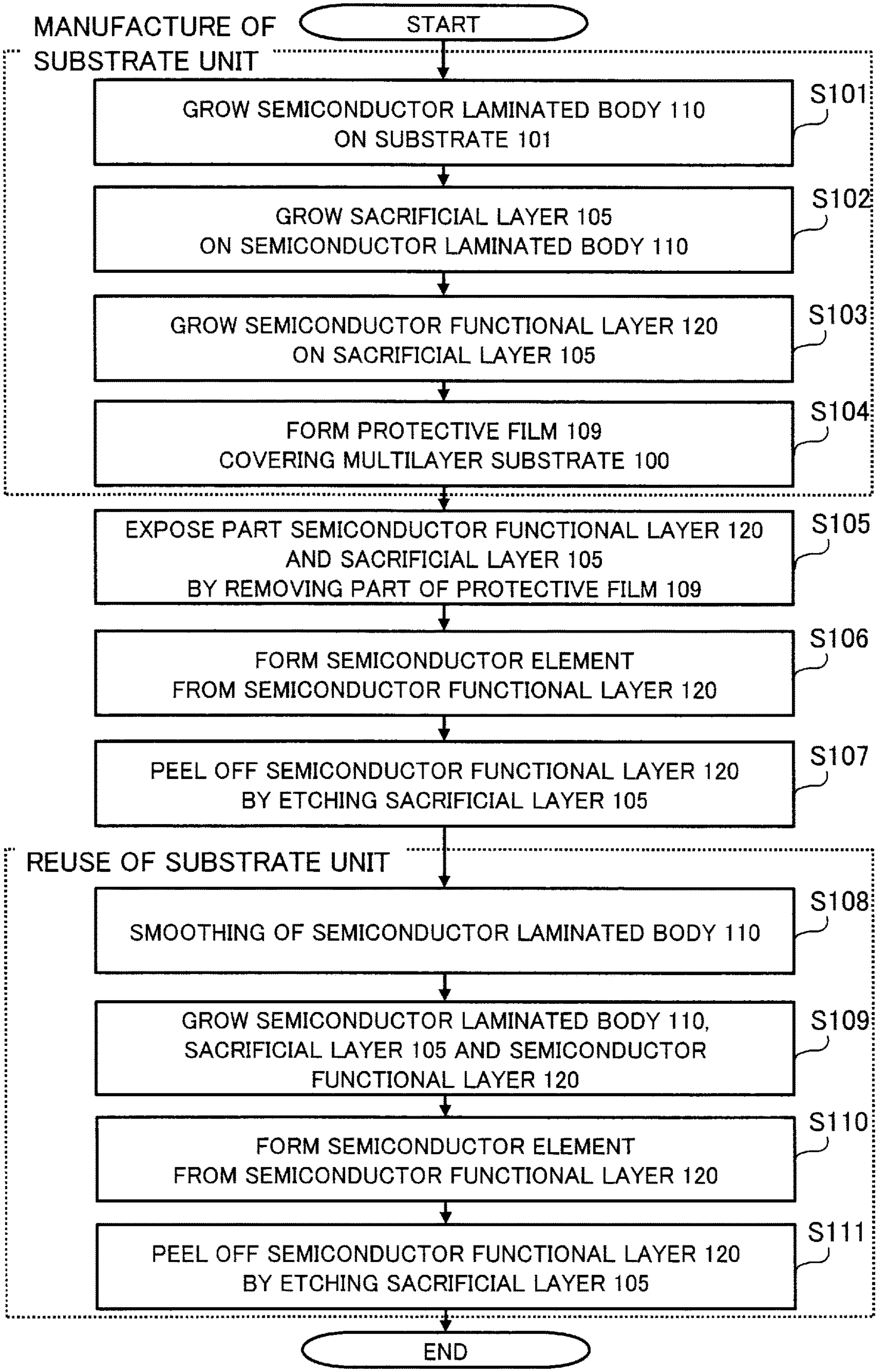
Figure 3:
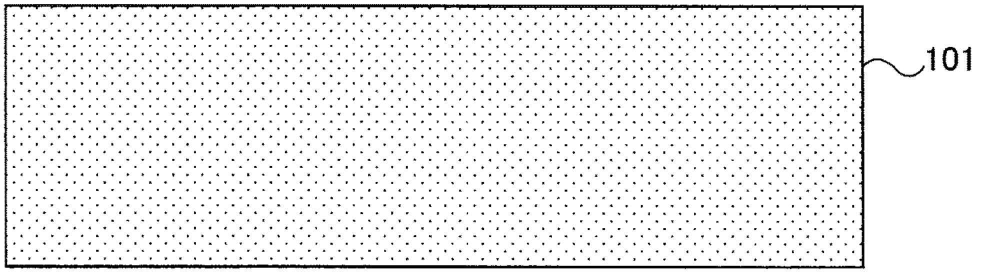
Figure 4:
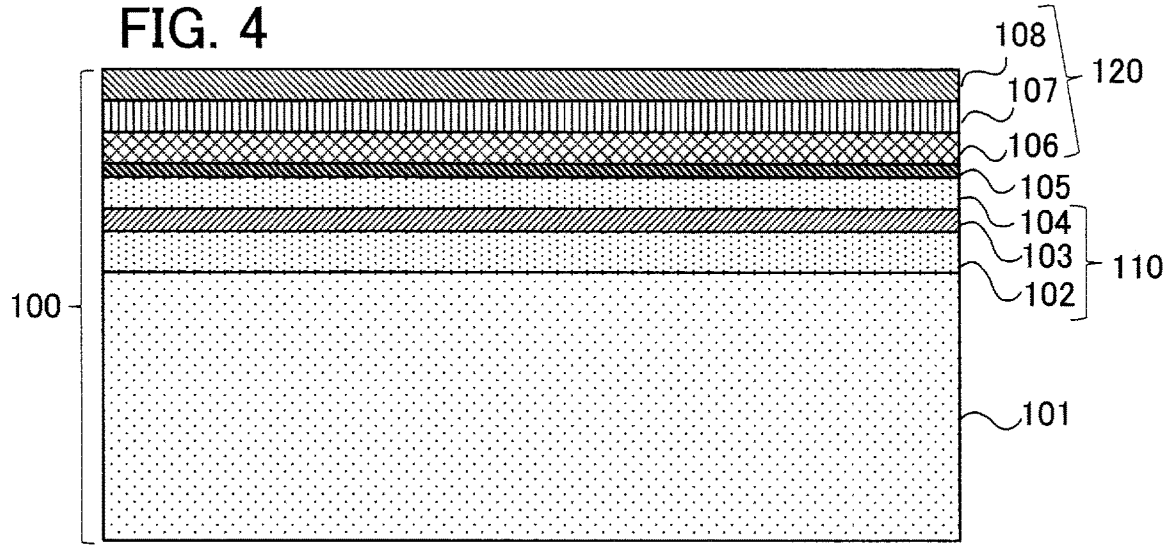
Figure 5:
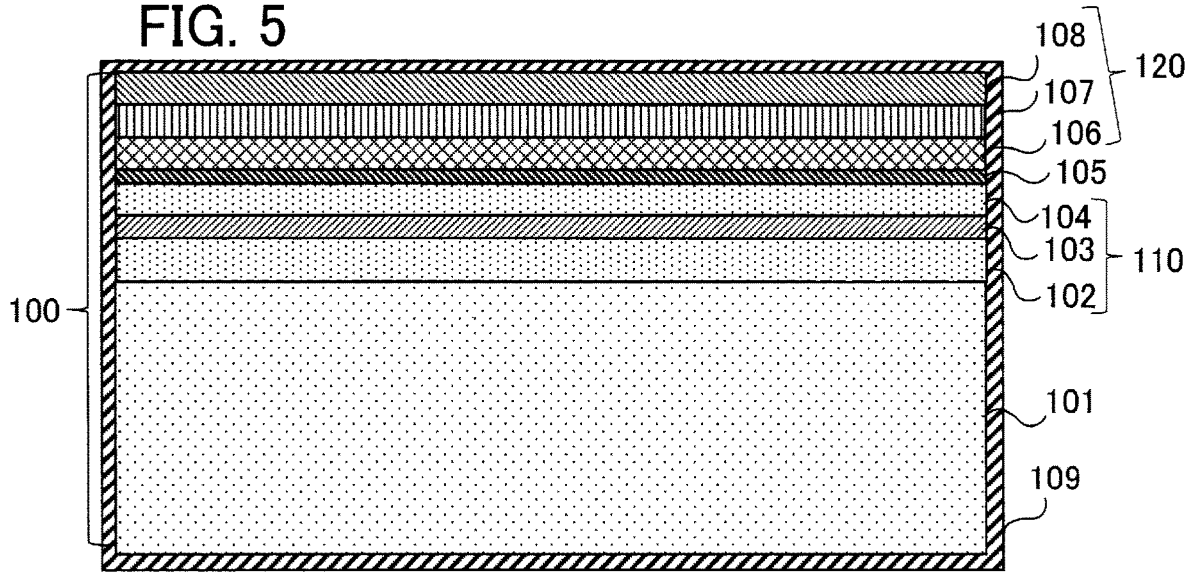
Figure 6A:
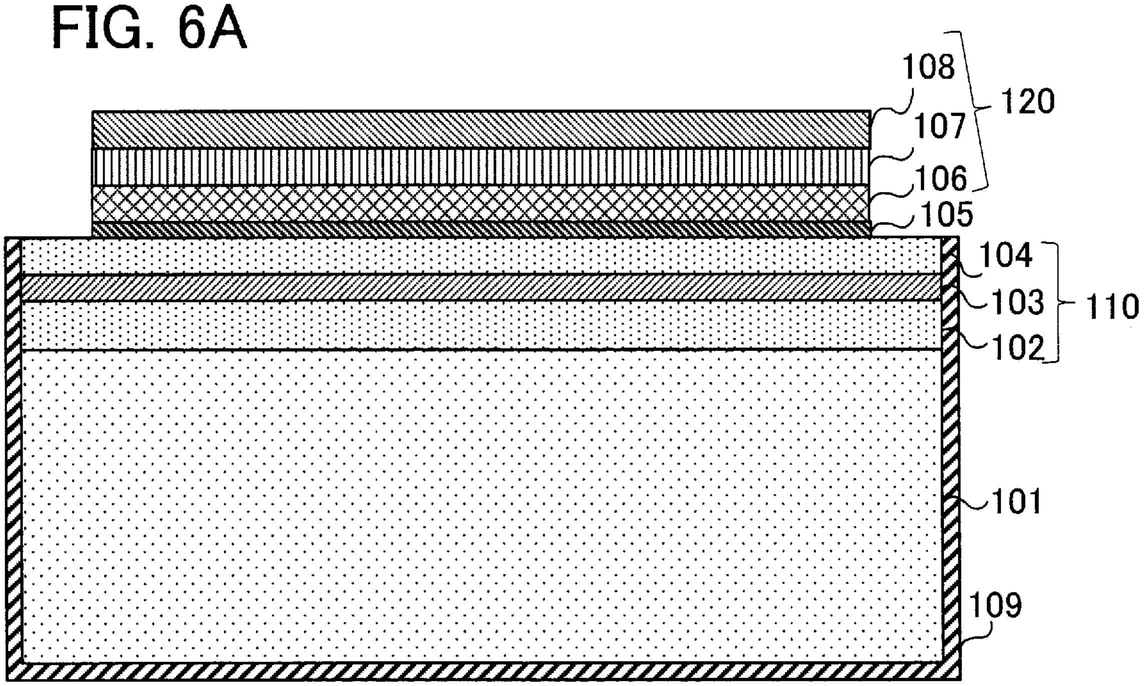
Figure 6B:
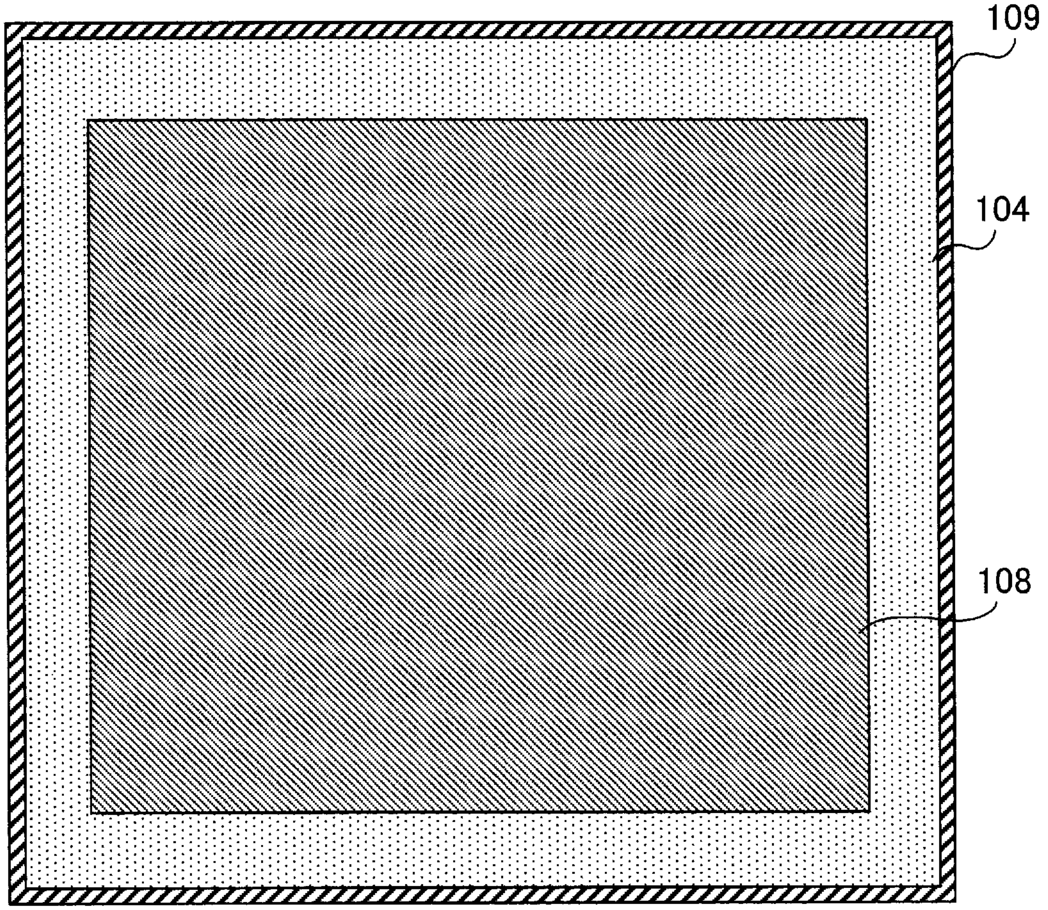
Figure 7A:
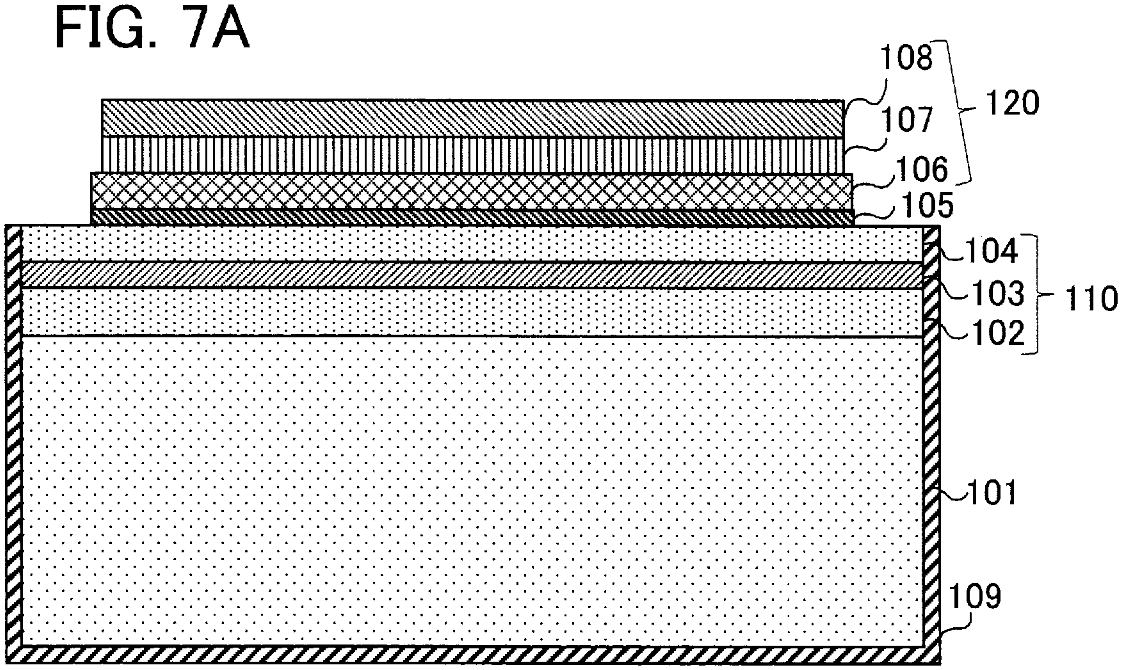
Figure 7B:
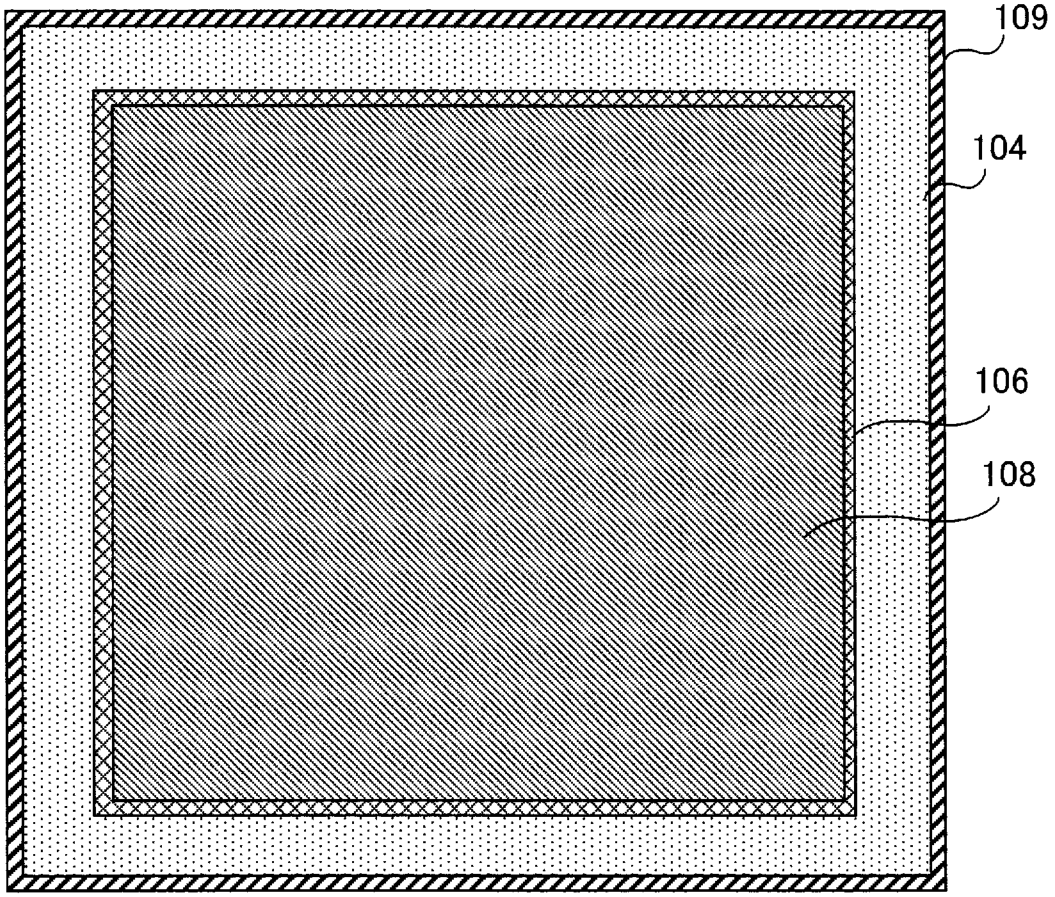
Figure 8A:
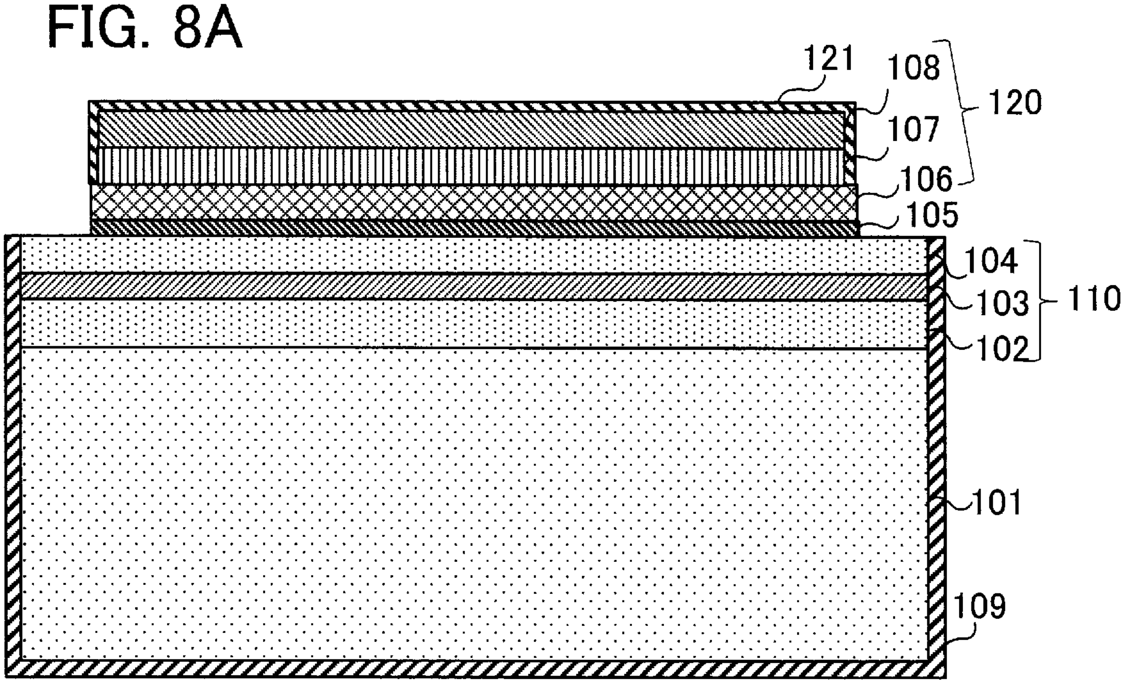
Figure 8B:
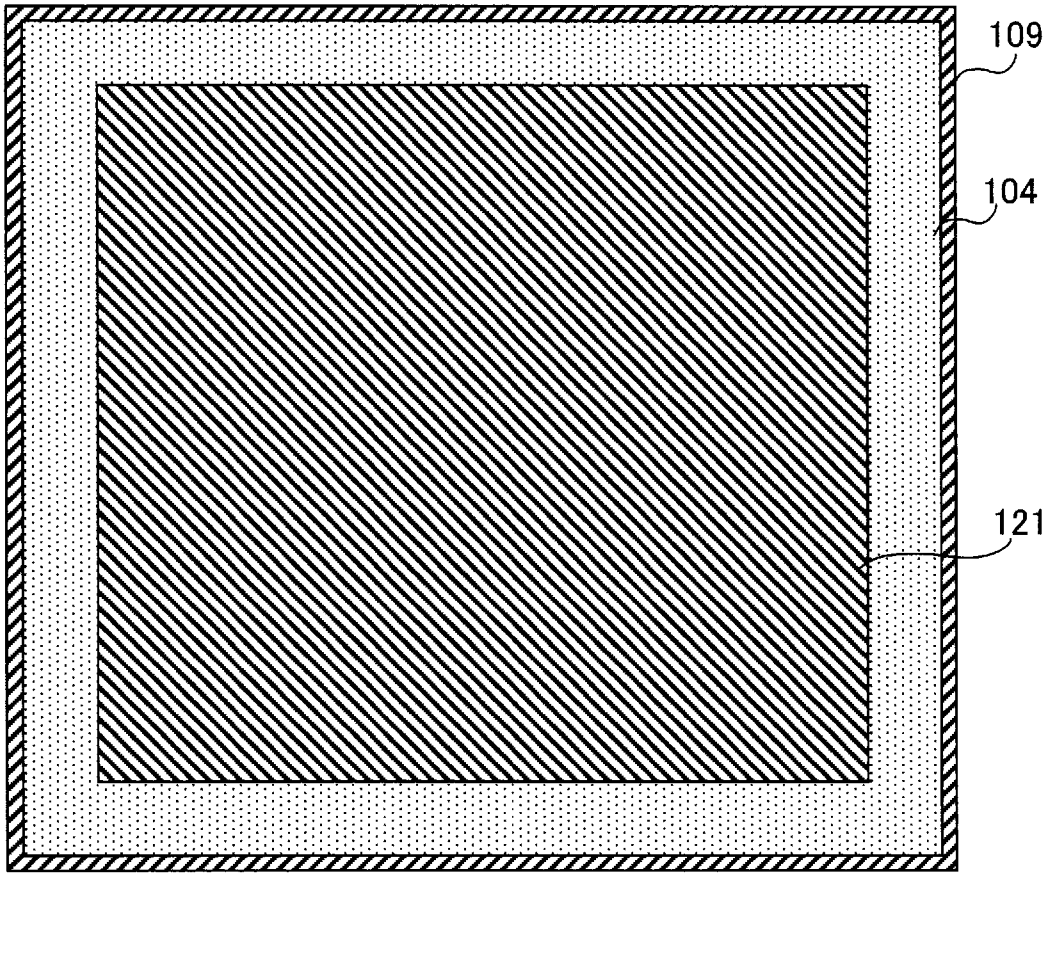
Figure 9:
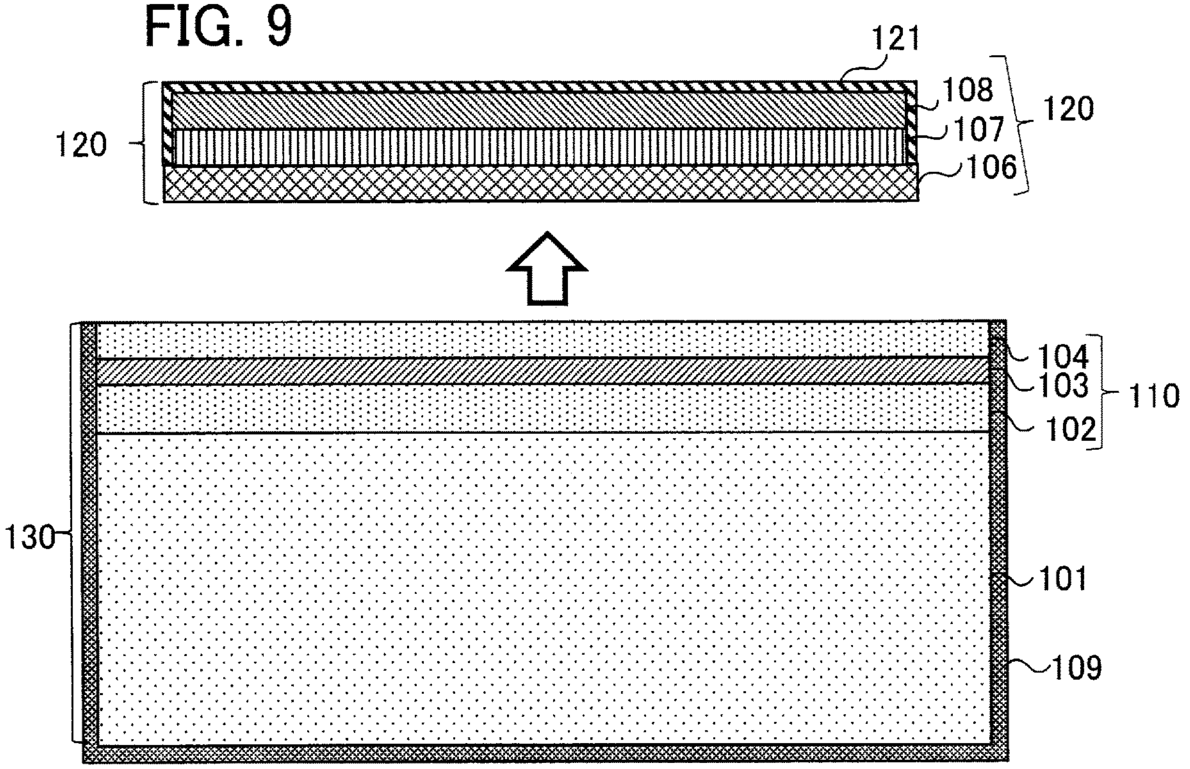
Figure 10:
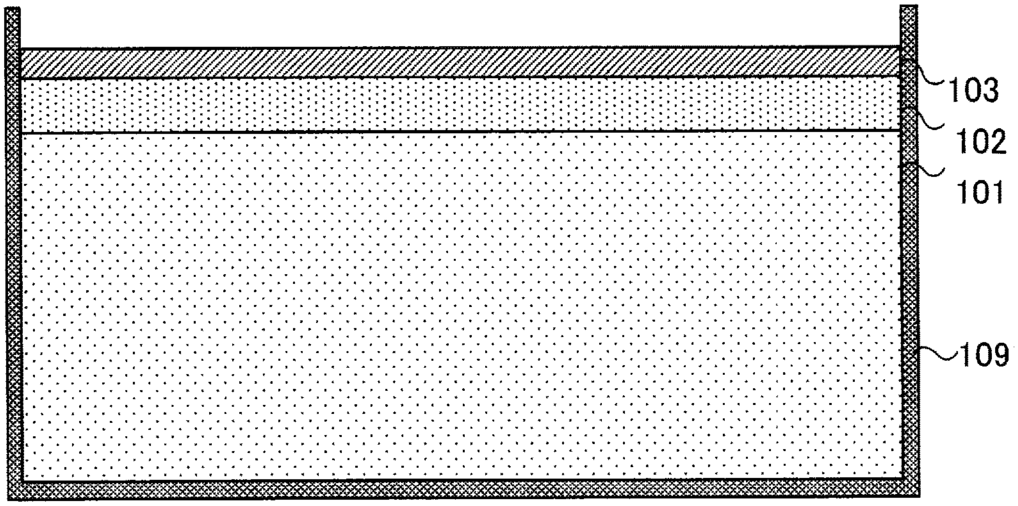
Figure 11:
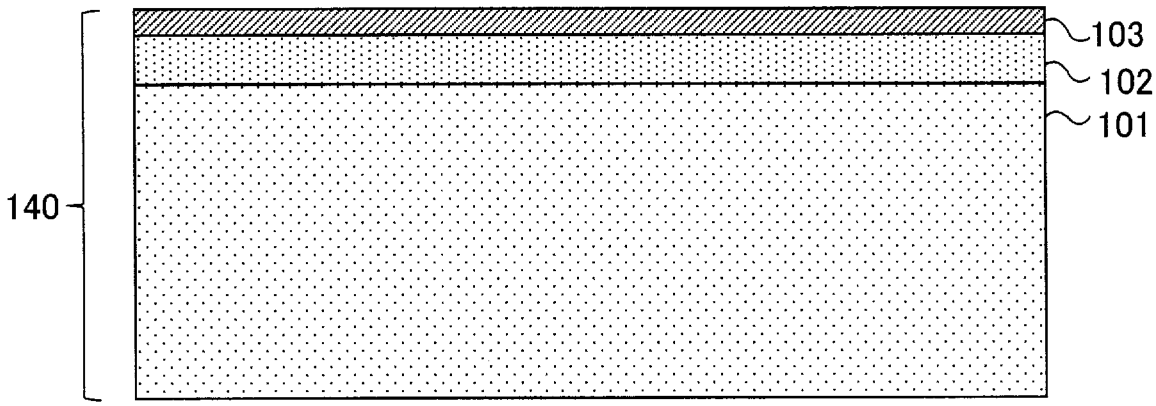
Figure 12:
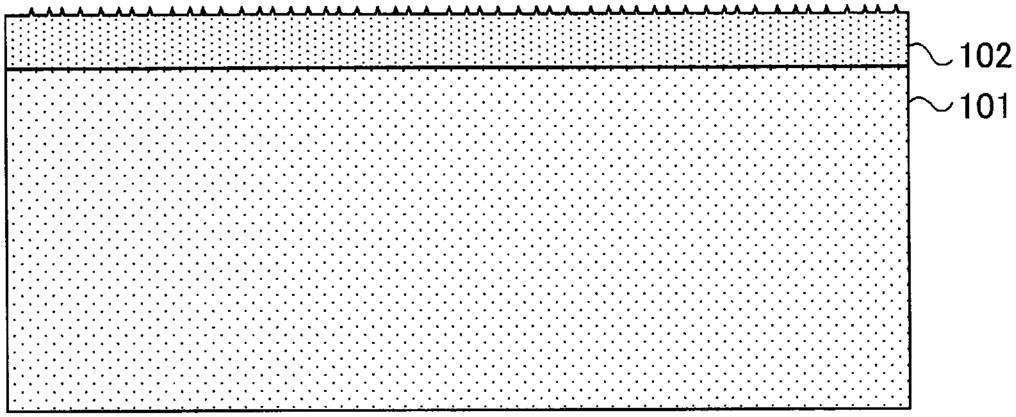
Figure 13:
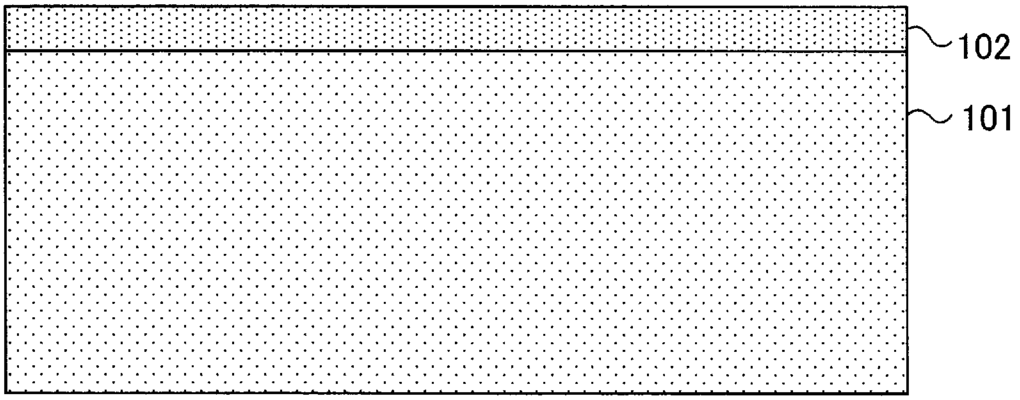
Figure 14:
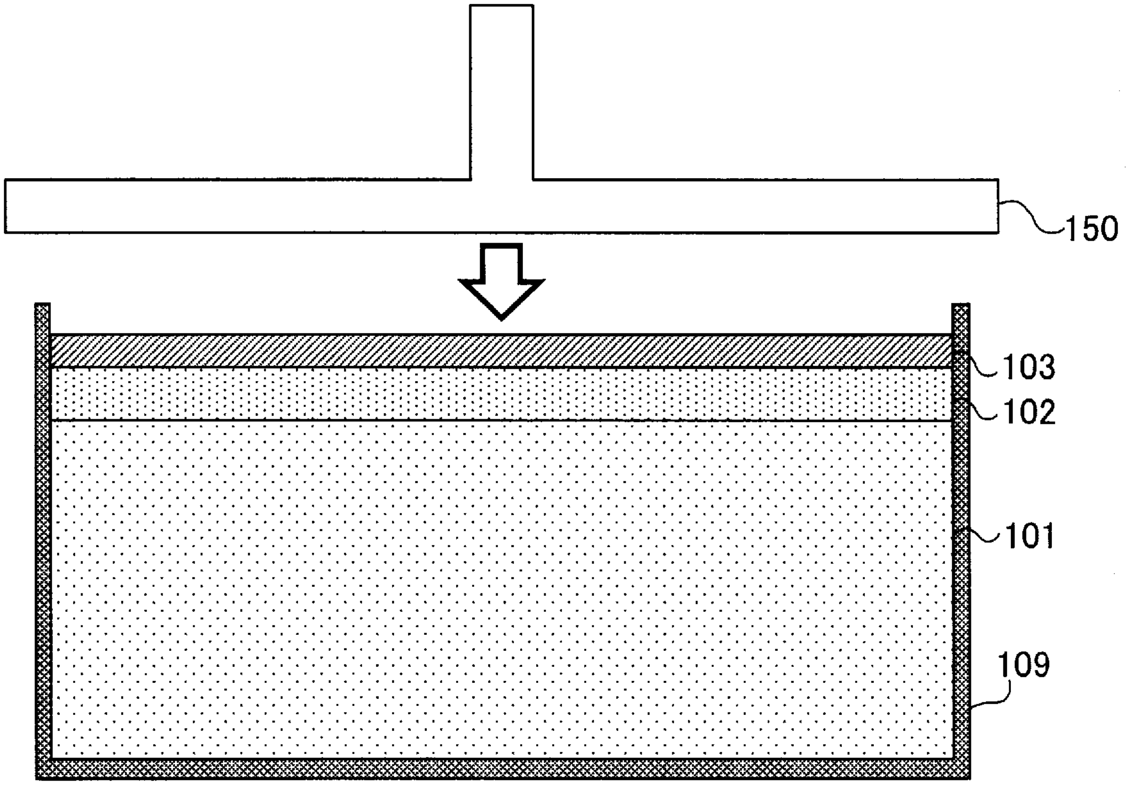
Figure 15:
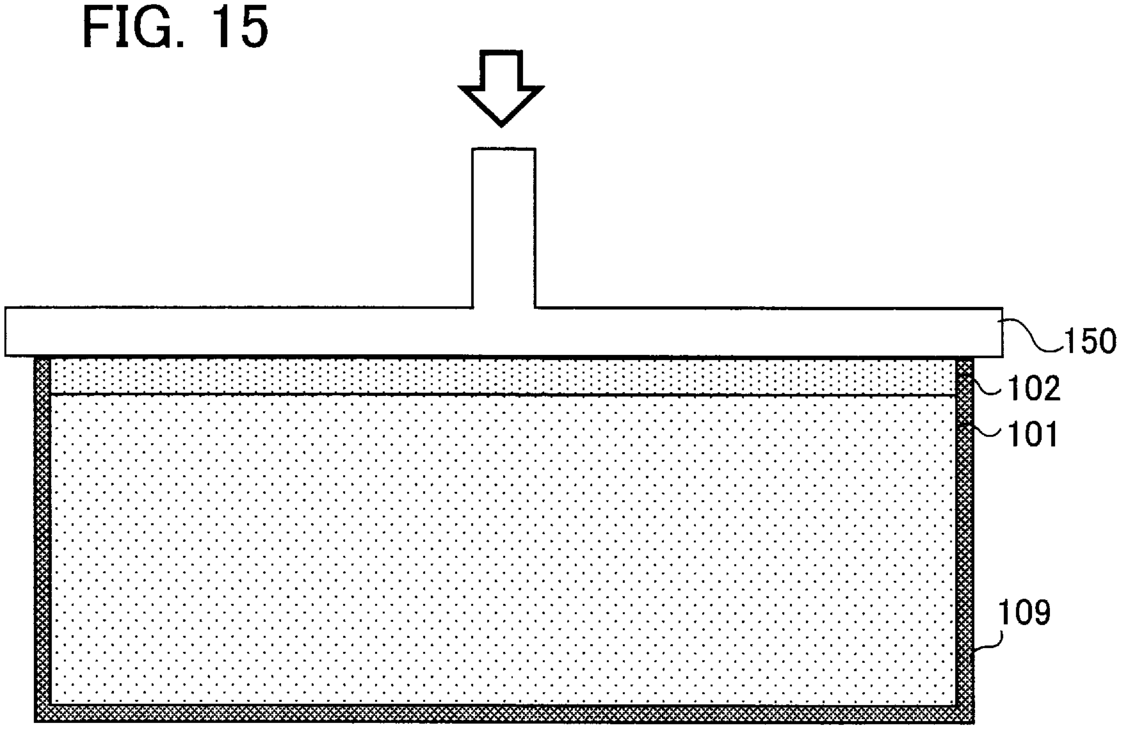
Figure 16:
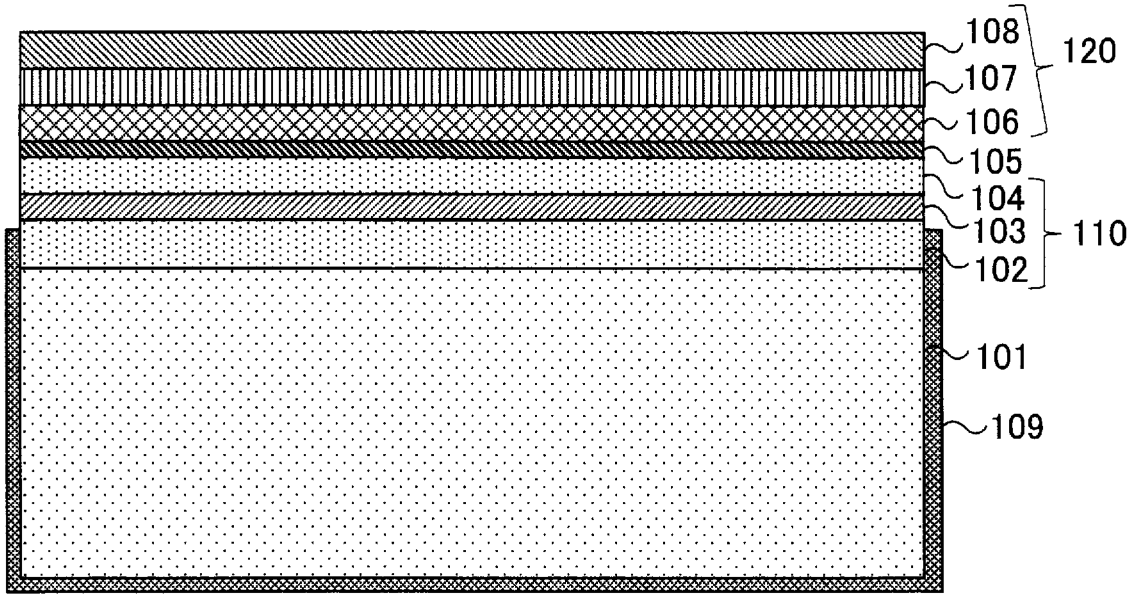
Figure 17:
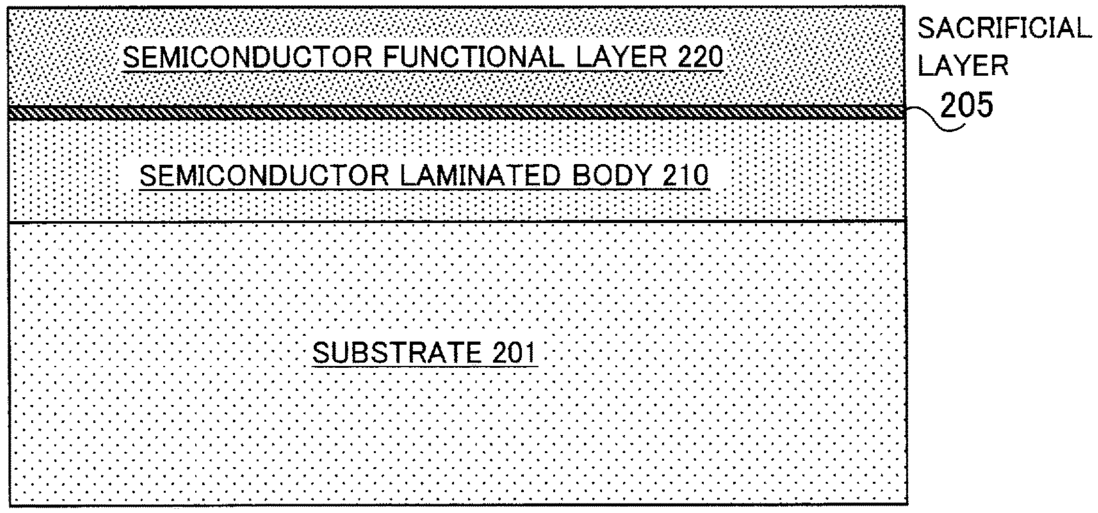
Figure 18:
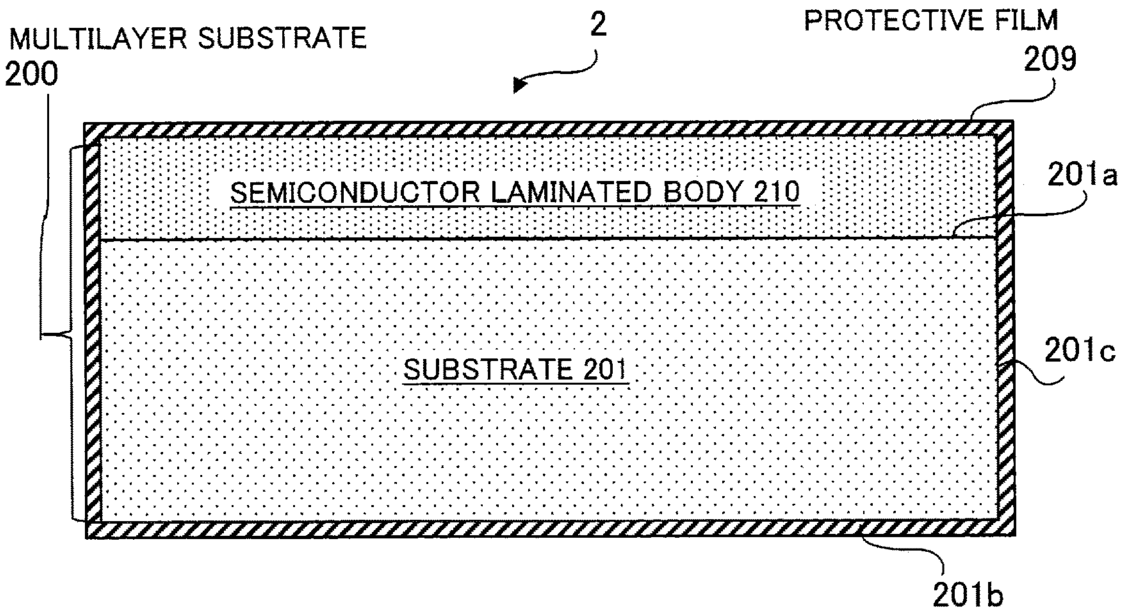
Figure 19:
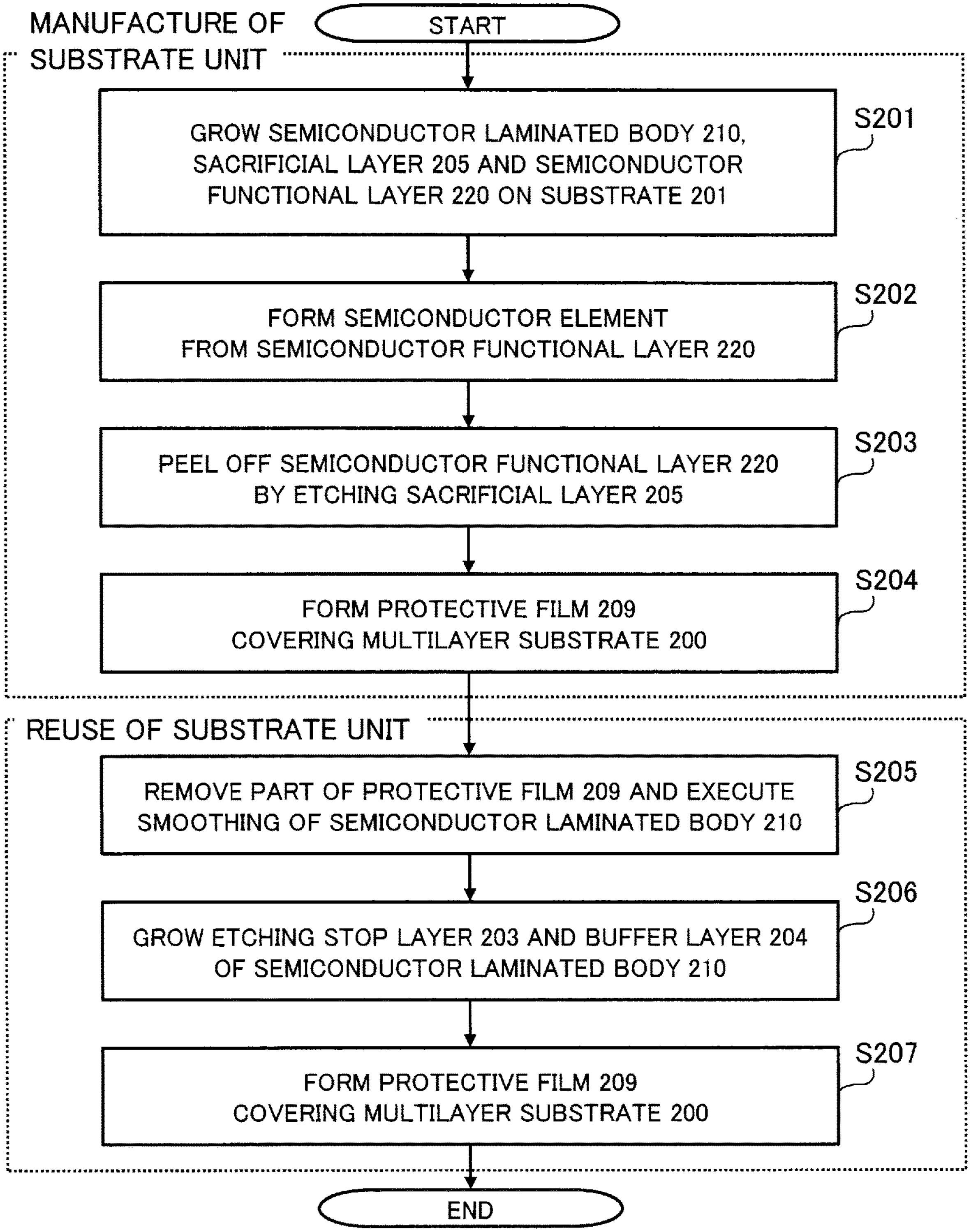
Figure 20:
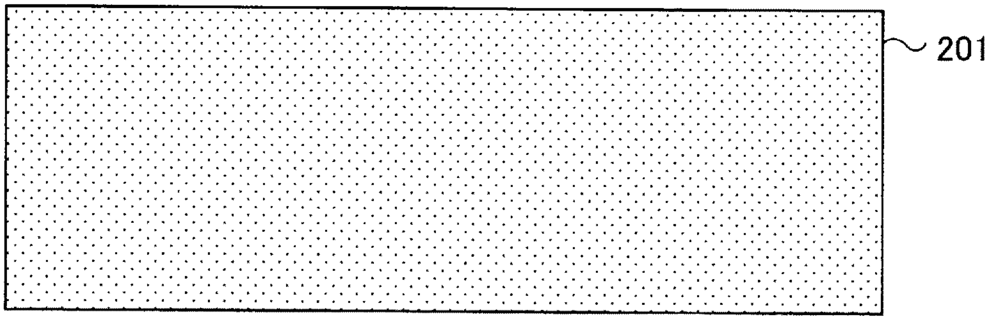
Figure 21:
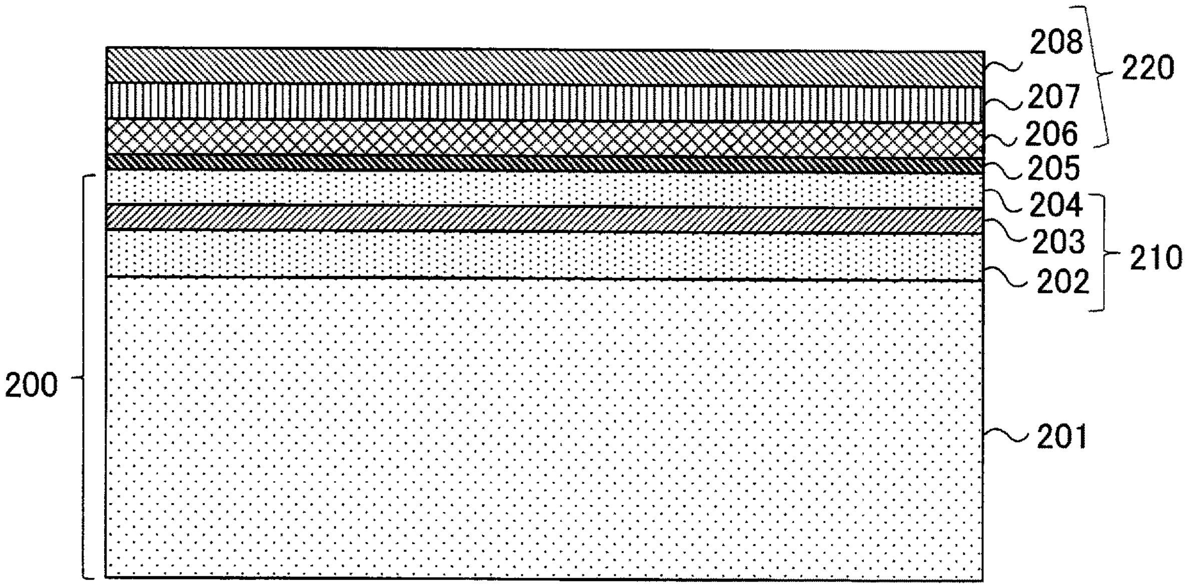
Figure 22A:
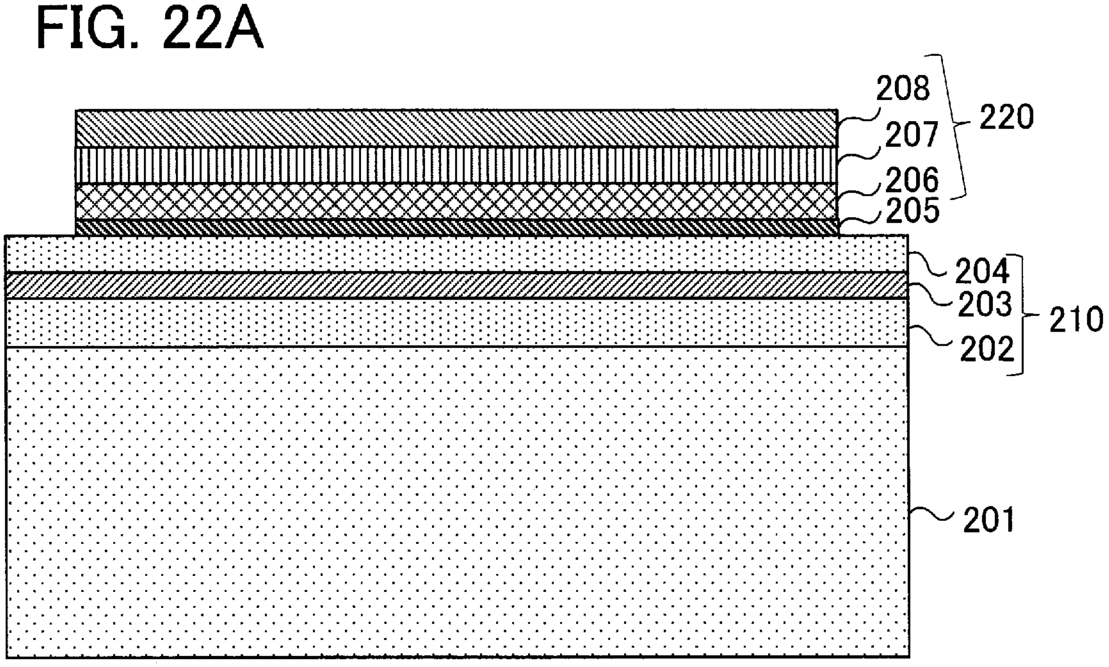
Figure 22B:
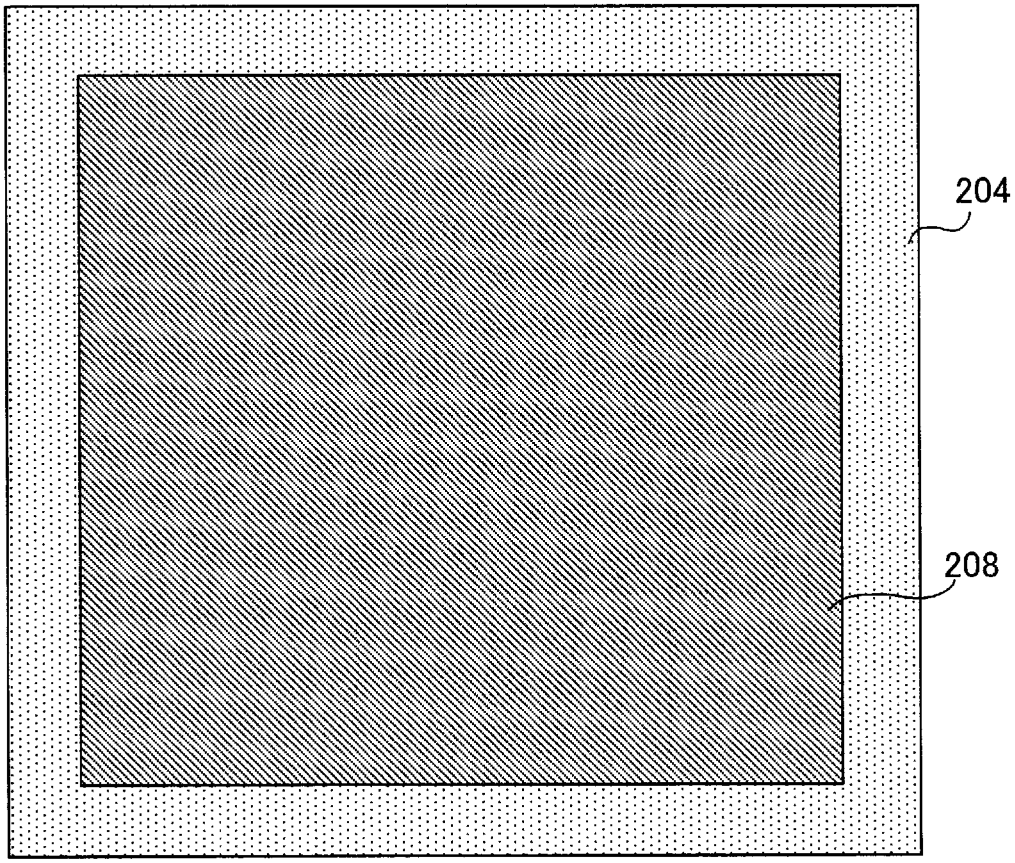
Figure 23A:
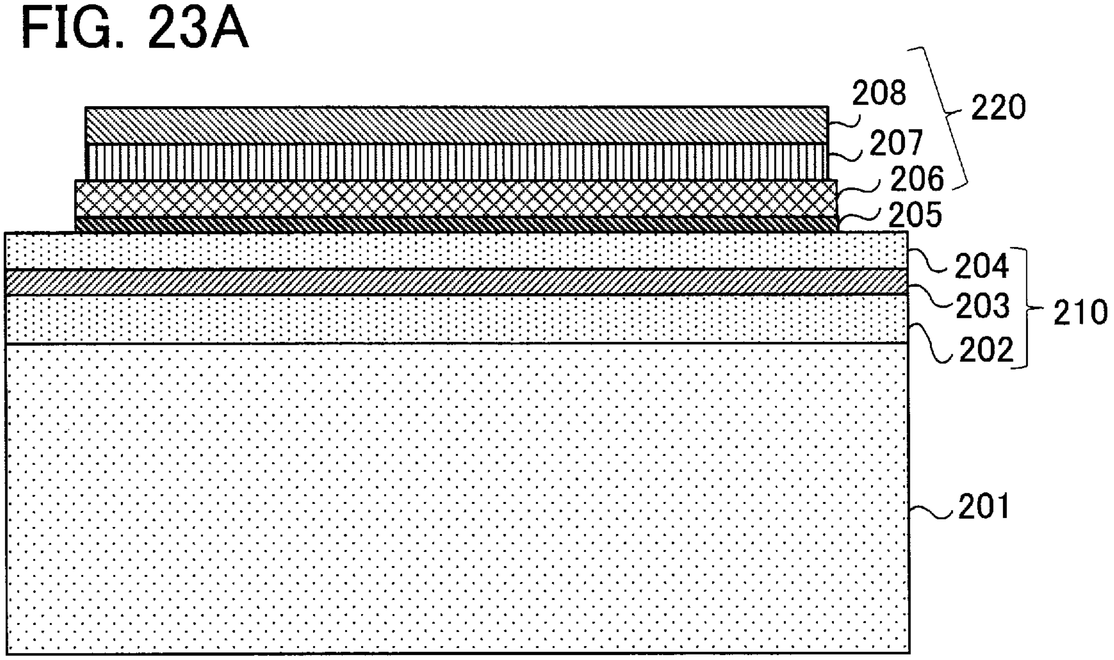
Figure 23B:
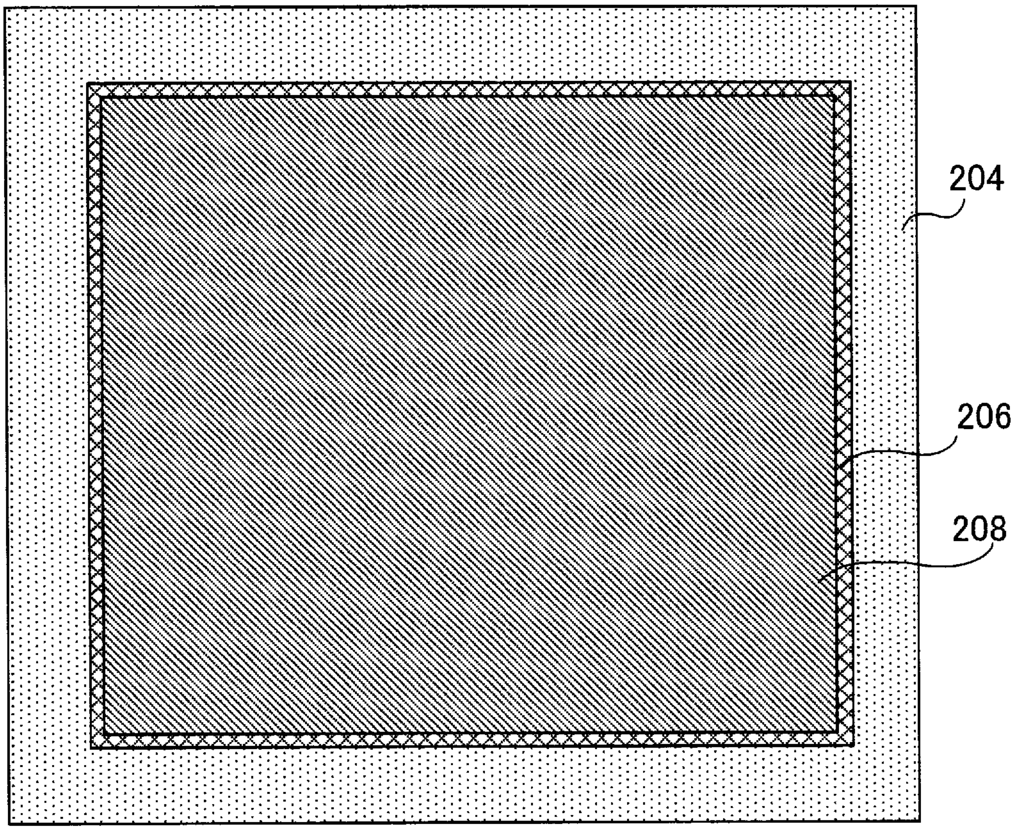
Figure 24A:
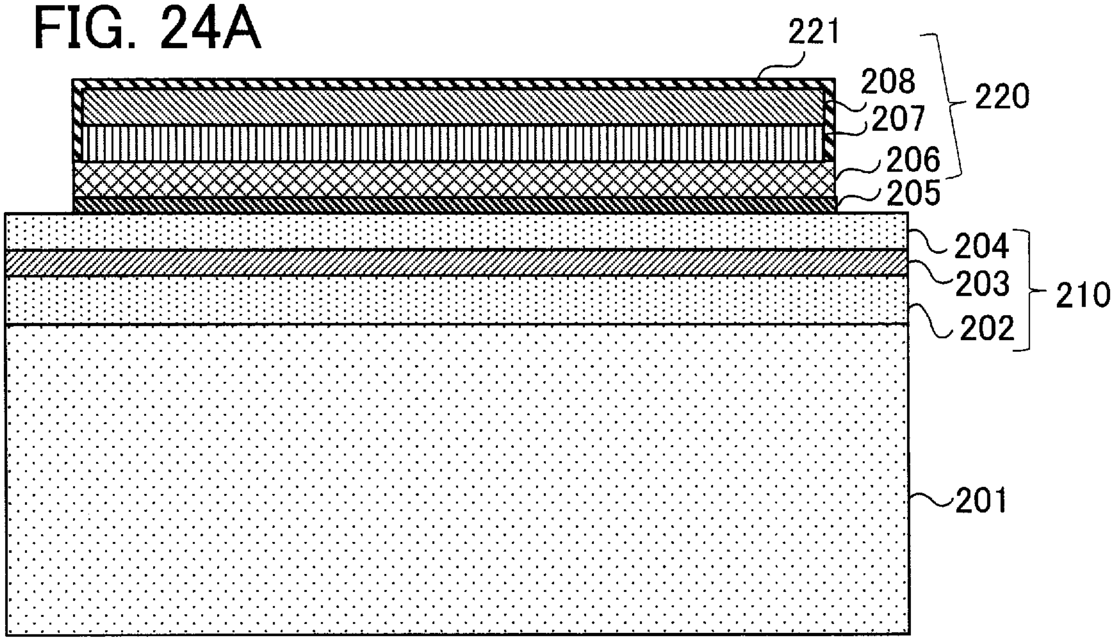
Figure 24B:
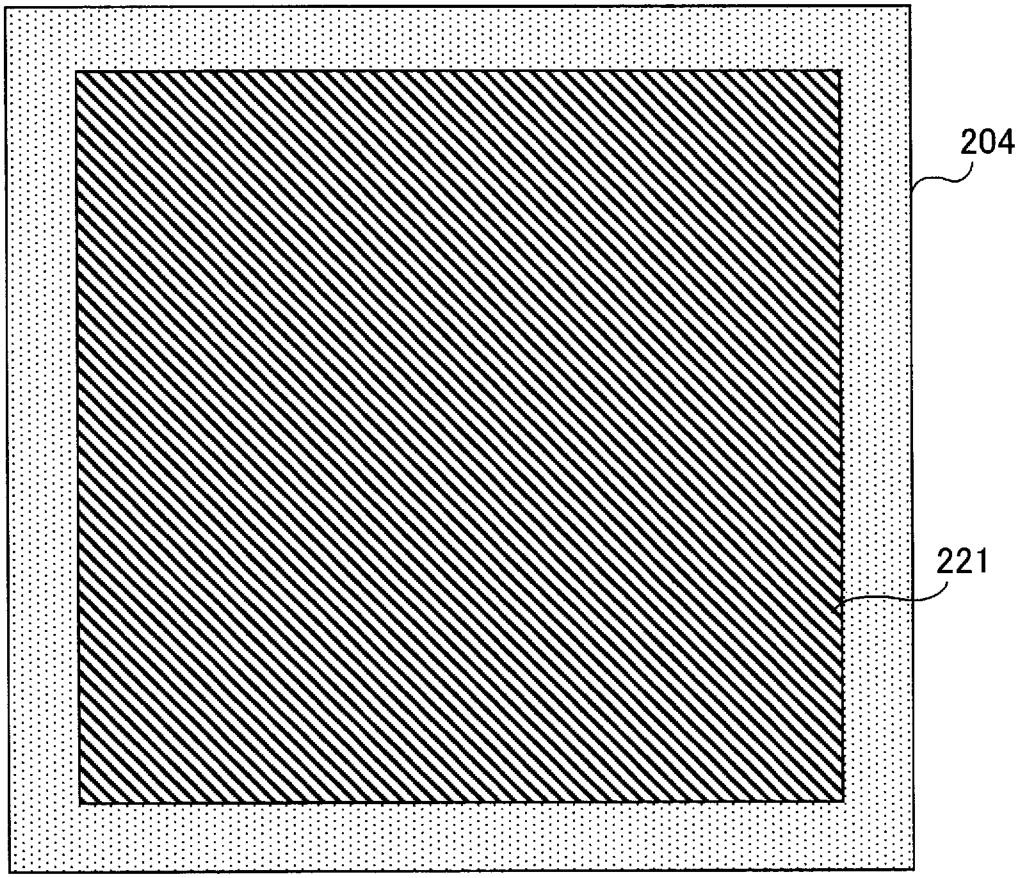
Figure 25:
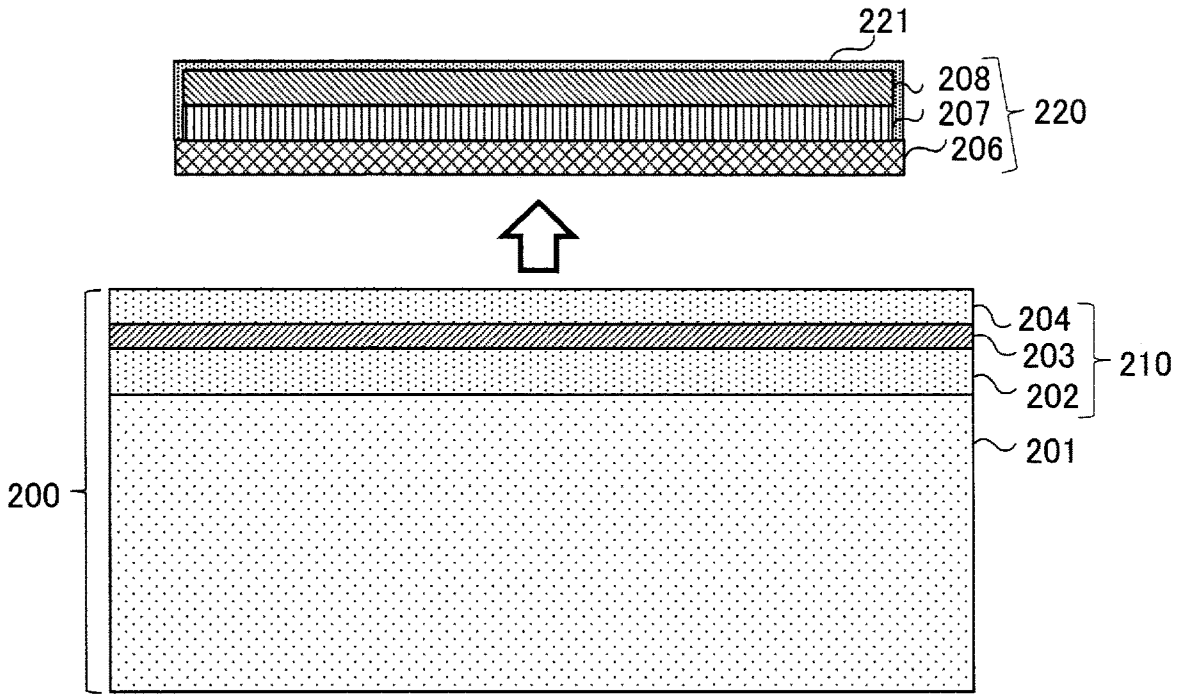
Figure 26:
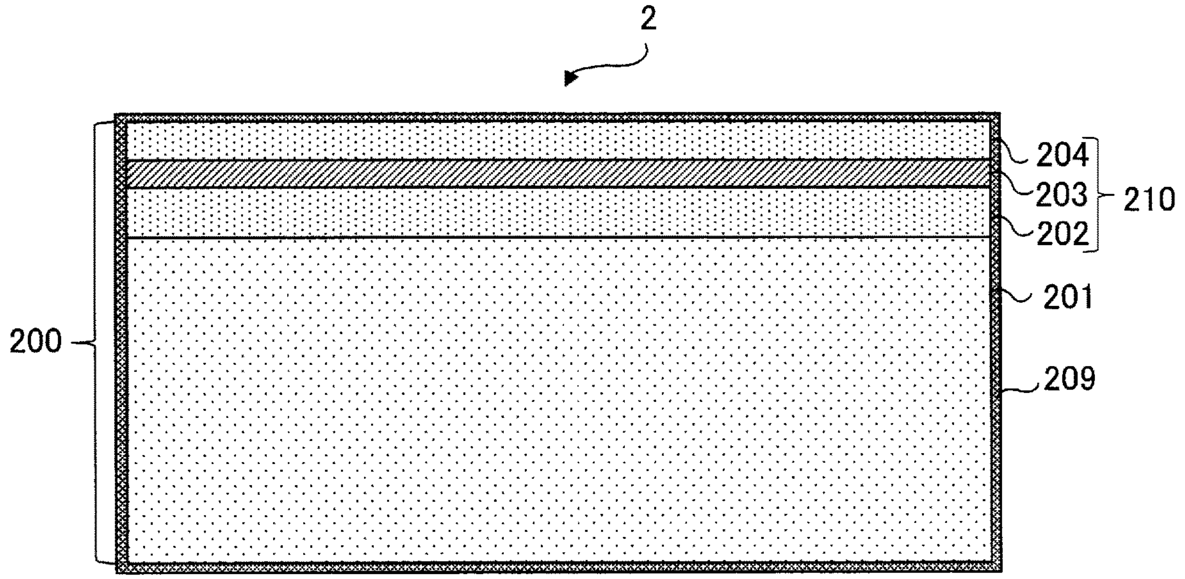
Figure 27:
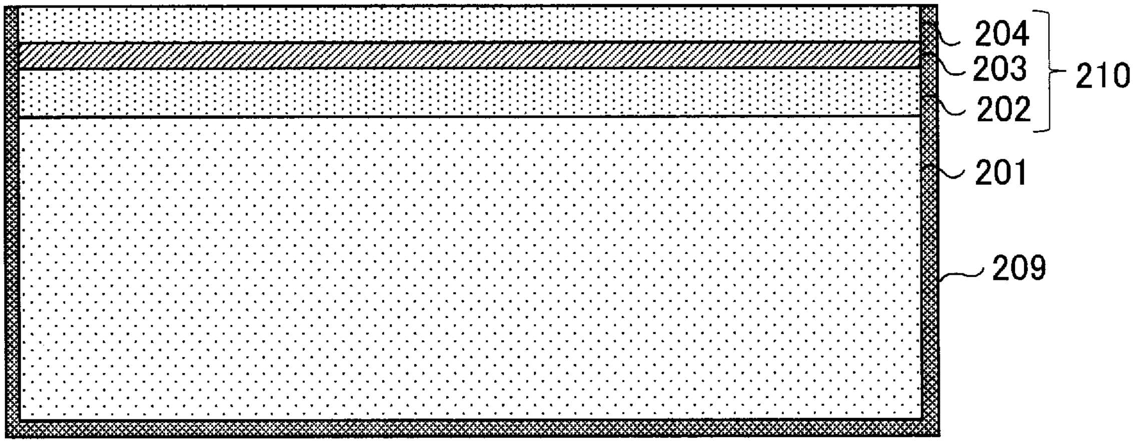
Figure 28:
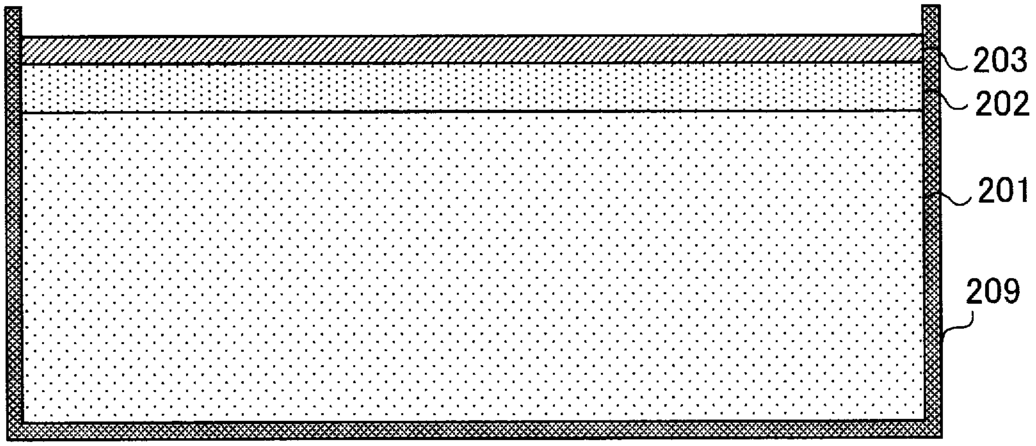
Figure 29:
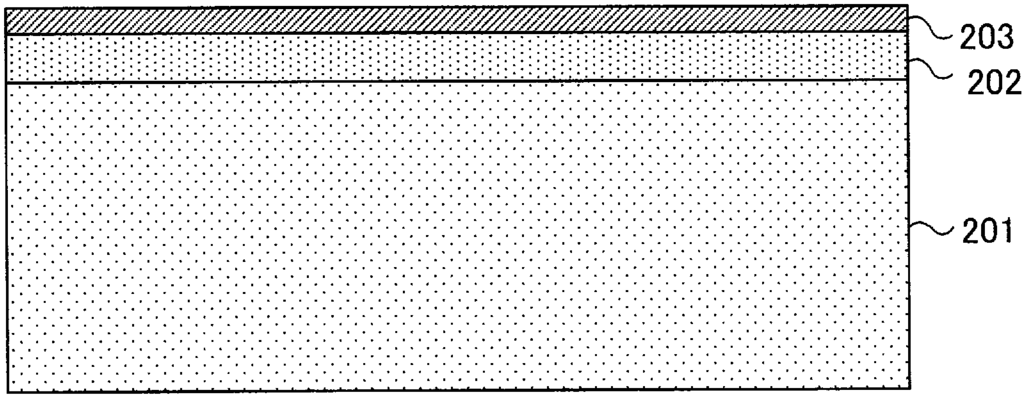
Figure 30:
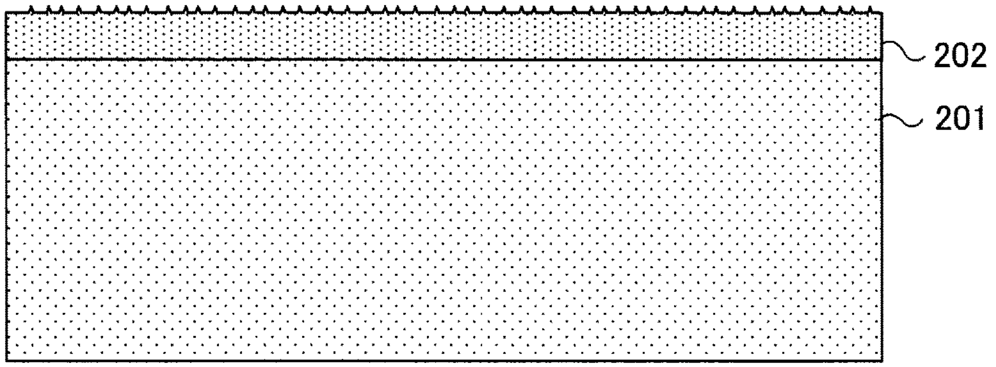
Figure 31:
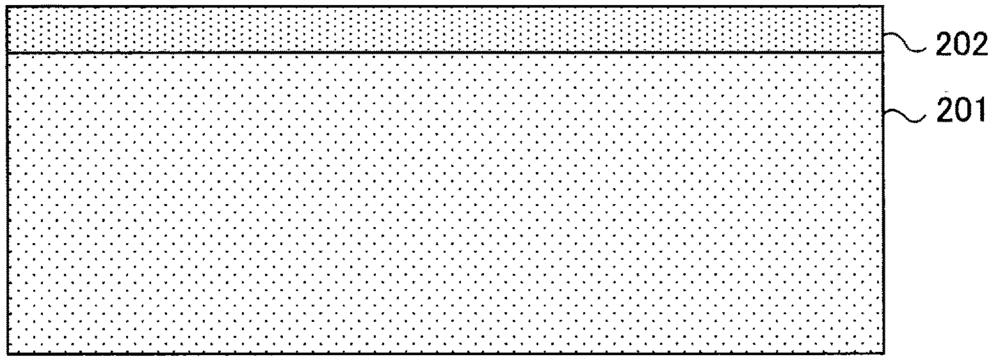
Figure 32:
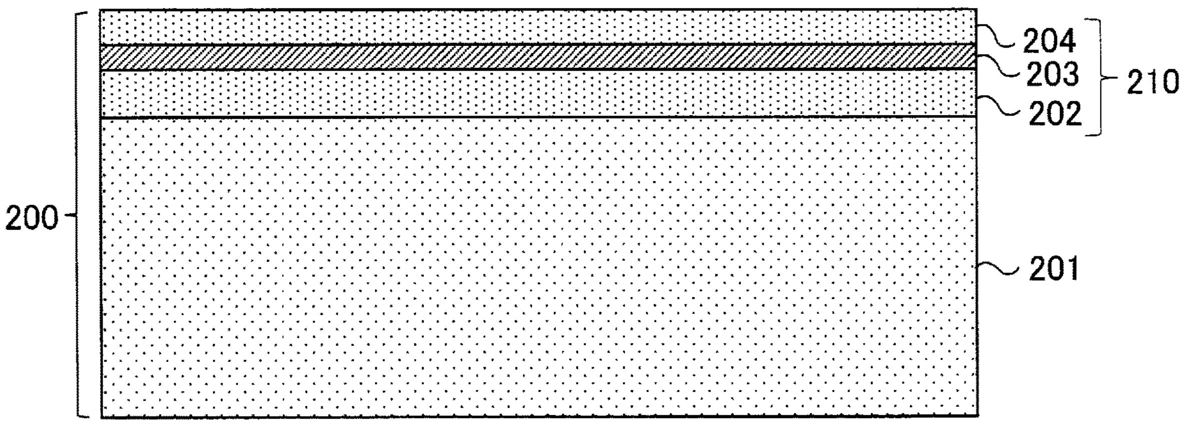
Figure 33:
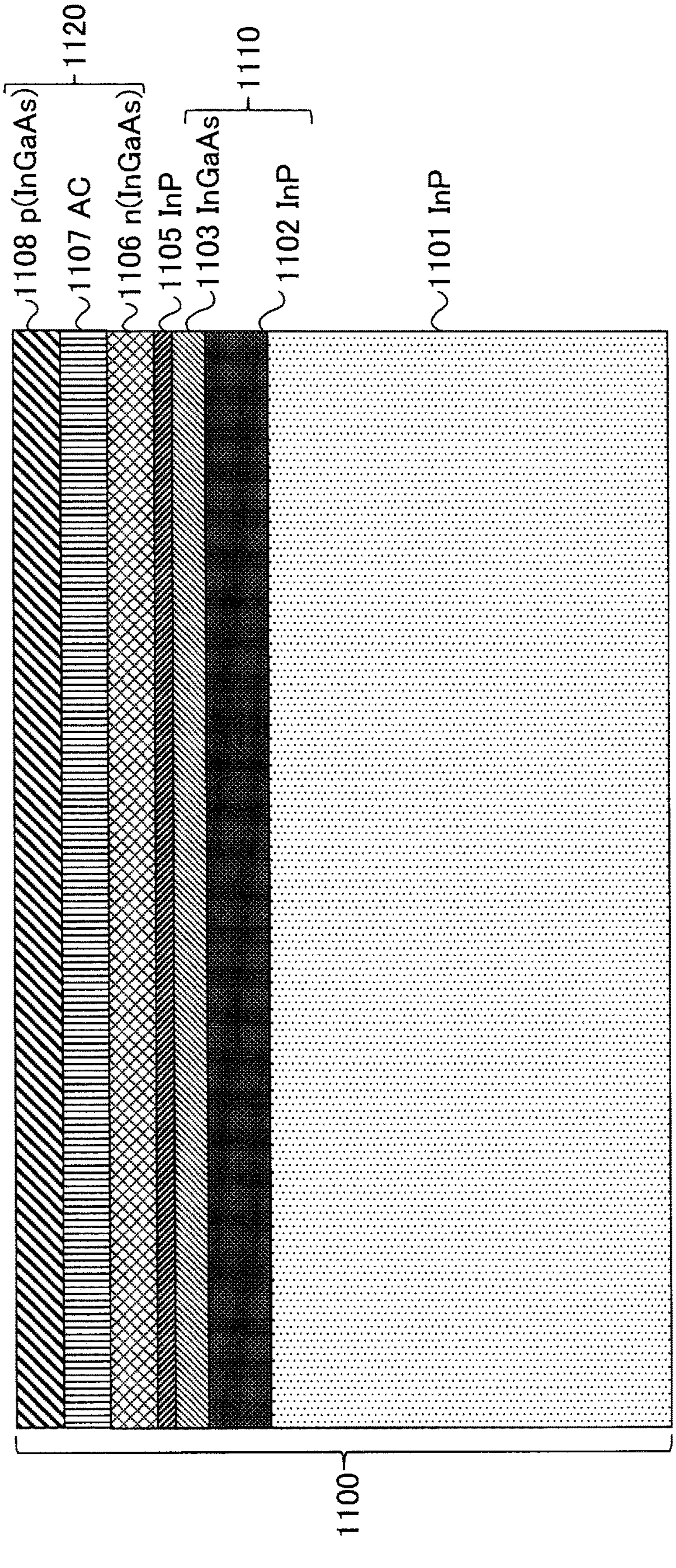
Figure 34:
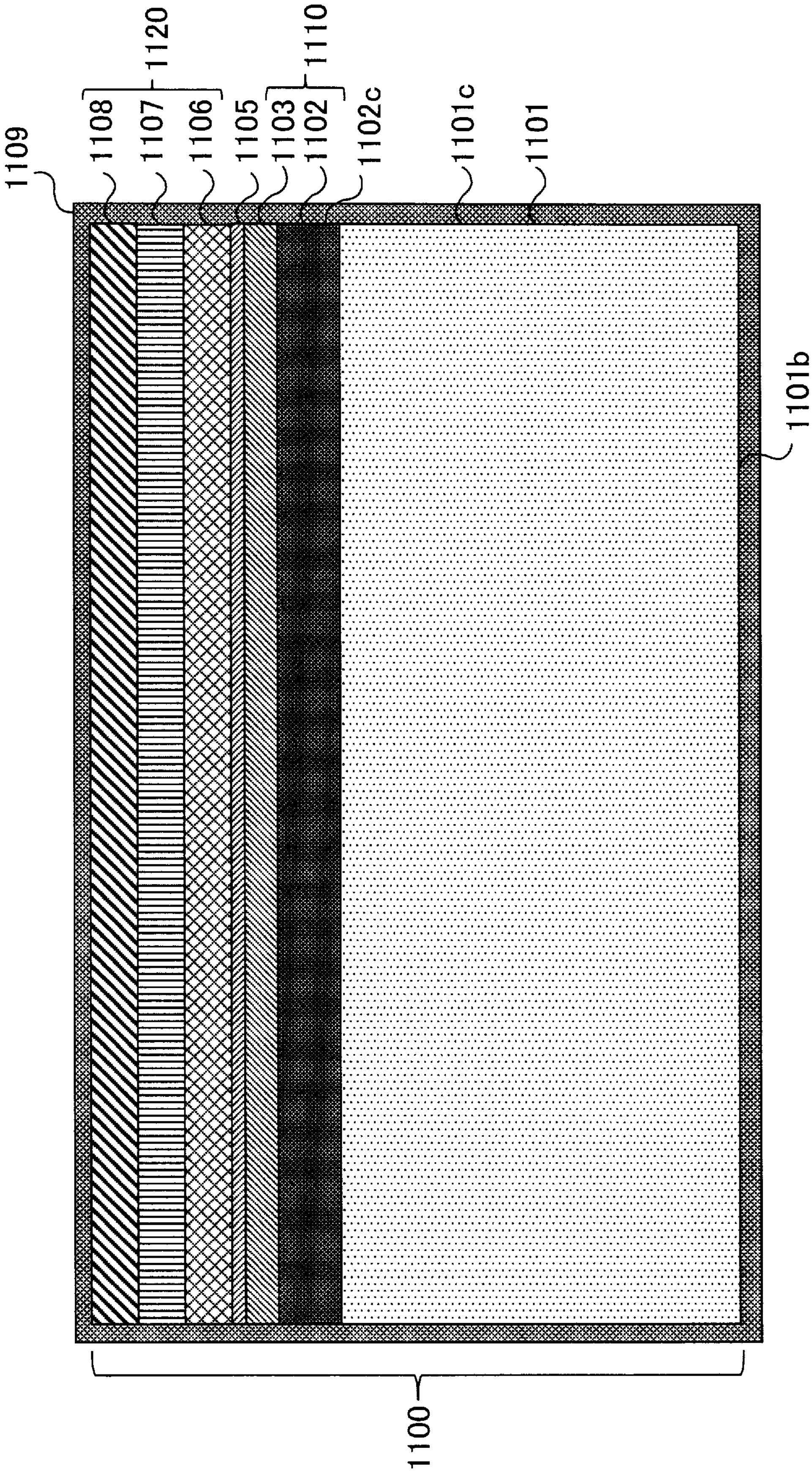

1B is a schematic diagram showing an upper surface of the substrate unit according to the first embodiment;

FIG. 2 is a flowchart showing a manufacturing method of the substrate unit according to the first embodiment;

FIG. 3 is a schematic cross-sectional view showing a manufacturing process (part 1) of the substrate unit according to the first embodiment;

FIG. 4 is a schematic cross-sectional view showing the manufacturing process (part 2) of the substrate unit according to the first embodiment;

FIG. 5 is a schematic cross-sectional view showing the manufacturing process (part 3) of the substrate unit according to the first embodiment;

FIGS. 6A and 6B are a schematic cross-sectional view and a schematic plan view showing a peeling process (part 1) of a semiconductor functional layer;

FIGS. 7A and 7B are a schematic cross-sectional view and a schematic plan view showing the peeling process (part 2) of the semiconductor functional layer;

FIGS. 8A and 8B are a schematic cross-sectional view and a schematic plan view showing the peeling process (part 3) of the semiconductor functional layer;

FIG. 9 is a schematic cross-sectional view showing the peeling process (part 4) of the semiconductor functional layer;

FIG. 10 is a schematic cross-sectional view showing a reuse process (part 1) of the substrate unit according to the first embodiment;

FIG. 11 is a schematic cross-sectional view showing the reuse process (part 2) of the substrate unit according to the first embodiment;

FIG. 12 is a schematic cross-sectional view showing the reuse process (part 3) of the substrate unit according to the first embodiment;

FIG. 13 is a schematic cross-sectional view showing the reuse process (part 4) of the substrate unit according to the first embodiment;

FIG. 14 is a schematic cross-sectional view showing a machine polishing process (part 1) of the substrate unit according to the first embodiment;

FIG. 15 is a schematic cross-sectional view showing the machine polishing process (part 2) of the substrate unit according to the first embodiment;

FIG. 16 is a schematic cross-sectional view showing the reuse process (part 5) of the substrate unit according to the first embodiment;

FIG. 17 is a schematic diagram showing a multilayer substrate as an original form of a substrate unit according to a second embodiment;

FIG. 18 is a schematic diagram showing a cross section of the substrate unit according to the second embodiment;

FIG. 19 is a flowchart showing a manufacturing method of the substrate unit according to the second embodiment;

FIG. 20 is a schematic cross-sectional view showing a manufacturing process (part 1) of the substrate unit according to the second embodiment;

FIG. 21 is a schematic cross-sectional view showing the manufacturing process (part 2) of the substrate unit according to the second embodiment;

FIGS. 22A and 22B are a schematic cross-sectional view and a schematic plan view showing the manufacturing process (part 3) of the substrate unit according to the second embodiment;

FIGS. 23A and 23B are a schematic cross-sectional view and a schematic plan view showing the manufacturing process (part 4) of the substrate unit according to the second embodiment;

FIGS. 24A and 24B are a schematic cross-sectional view and a schematic plan view showing the manufacturing process (part 5) of the substrate unit according to the second embodiment;

FIG. 25 is a schematic cross-sectional view showing the manufacturing process (part 6) of the substrate unit according to the second embodiment;

FIG. 26 is a schematic cross-sectional view showing the manufacturing process (part 7) of the substrate unit according to the second embodiment;

FIG. 27 is a schematic cross-sectional view showing a reuse process (part 1) of the substrate unit according to the second embodiment;

FIG. 28 is a schematic cross-sectional view showing the reuse process (part 2) of the substrate unit according to the second embodiment;

FIG. 29 is a schematic cross-sectional view showing the reuse process (part 3) of the substrate unit according to the second embodiment;

FIG. 30 is a schematic cross-sectional view showing the reuse process (part 4) of the substrate unit according to the second embodiment;

FIG. 31 is a schematic cross-sectional view showing the reuse process (part 5) of the substrate unit according to the second embodiment;

FIG. 32 is a schematic cross-sectional view showing the reuse process (part 6) of the substrate unit according to the second embodiment;

FIG. 33 is a schematic diagram showing a cross section of a multilayer substrate as an original form of a substrate unit according to a modification 2 of the first embodiment; and FIG. 34 is a schematic diagram showing a cross section of a substrate unit according to the modification 2 of the first embodiment.

DETAILED DESCRIPTION OF THE INVENTION

A manufacturing method of a substrate unit and a substrate unit according to each embodiment of the present disclosure will be described below with reference to the drawings. The following embodiments are just examples and a variety of modifications are possible within the scope of the present disclosure.

(1) FIRST EMBODIMENT

(1-1) General Outline of First Embodiment

Figure 1A:
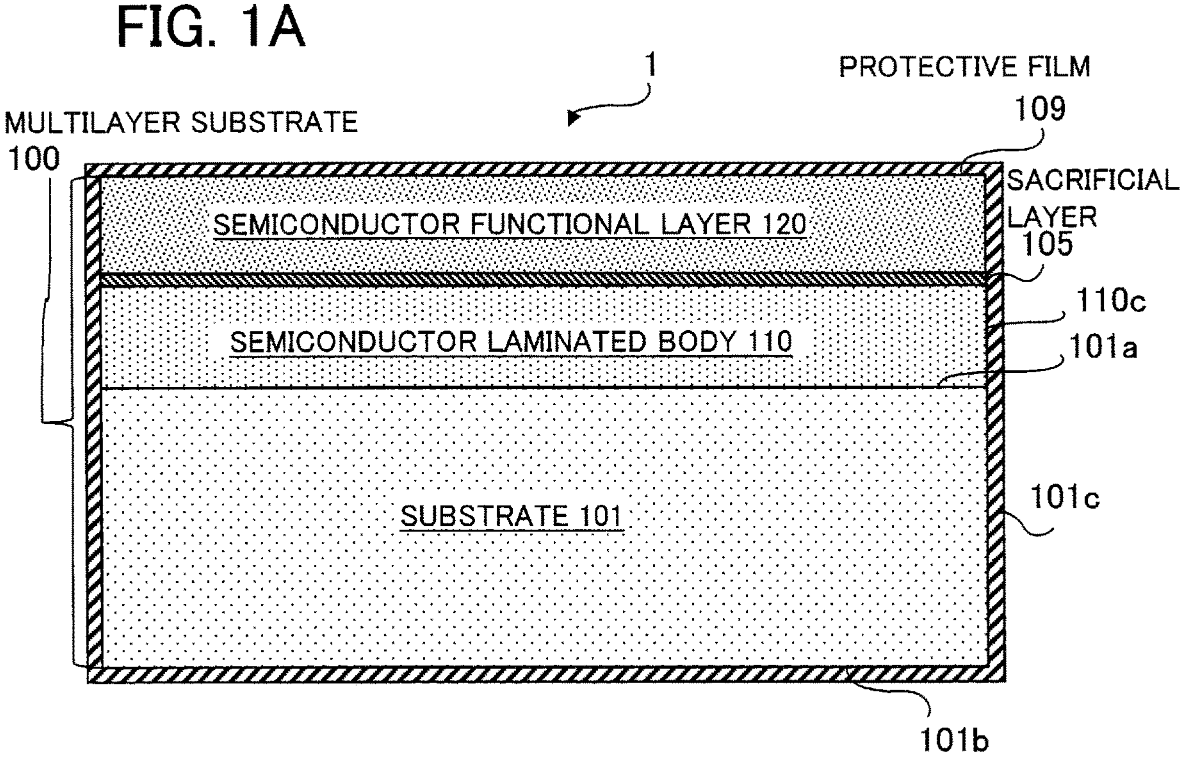
FIG. 1A is a schematic diagram showing a cross section of a substrate unit according to a first embodiment, and FIG.
Figure 1B:
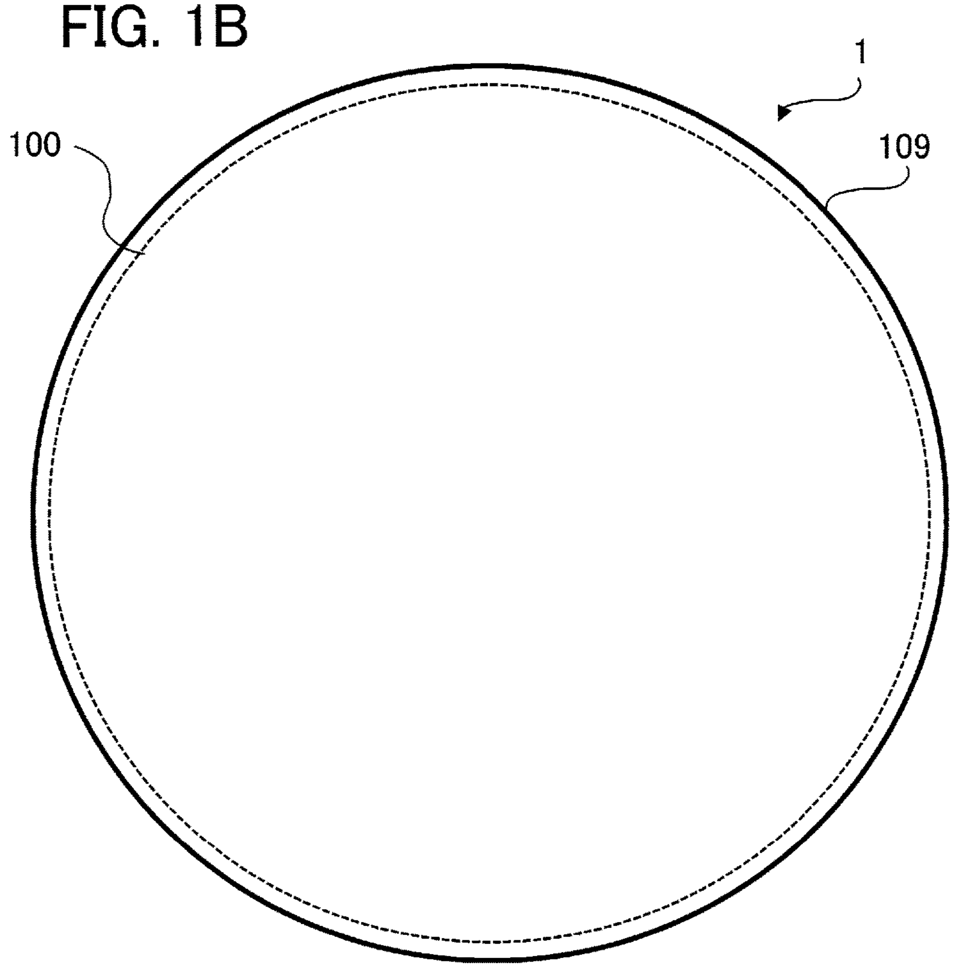

FIG. 1A is a schematic diagram showing a cross section of a substrate unit 1 according to a first embodiment, and FIG. 1B is a schematic diagram showing an upper surface of the substrate unit 1.

The substrate unit 1 includes a multilayer substrate 100 including a plurality of semiconductor layers stacked up and a protective film 109 covering the whole of the multilayer substrate 100. The multilayer substrate 100 includes a substrate 101 that is a semiconductor substrate (e.g., semiconductor wafer), a semiconductor laminated body 110 provided on the substrate 101, a sacrificial layer 105 provided on the semiconductor laminated body 110, and a semiconductor functional layer 120 provided on the sacrificial layer 105.

The semiconductor laminated body 110 includes one or a plurality of semiconductor layers formed on the substrate 101 by epitaxial growth as crystal growth. A concrete example of the semiconductor laminated body 110 will be described later.

The sacrificial layer 105 is a semiconductor layer formed on the semiconductor laminated body 110 by epitaxial growth as crystal growth. The sacrificial layer 105 is formed with a material that is easily etched by an etchant material used (i.e., that has higher etching speed than other layers). A concrete example of the sacrificial layer 105 will be described later.

The semiconductor functional layer 120 is a semiconductor layer in which semiconductor elements are to be formed. From the semiconductor functional layer 120 shown in FIG. 1A, a plurality of semiconductor elements split and two-dimensionally arranged on the substrate 101 by processing (i.e., a plurality of split semiconductor functional layers 120) are formed. By etching the sacrificial layer 105, each of the plurality of semiconductor elements (i.e., each of the plurality of split semiconductor functional layers 120) can be separated (i.e., peeled off) from the semiconductor laminated body 110. Each of the semiconductor functional layers 120 has a function as a semiconductor device (e.g., a light source, an optical detector, an image sensor, or the like) or a semiconductor element (e.g., a light emitting element, a light receiving element, a piezoelectric element, or the like). The separated semiconductor functional layer 120 is lifted and conveyed by a moving device (not shown) and is stuck on a mounting substrate (not shown) by intermolecular force, for example. A concrete example of the semiconductor functional layer 120 will be described later.

While the protective film 109 covers the whole of the multilayer substrate 100 in FIG. 1, the protective film 109 does not necessarily need to cover the whole of the multilayer substrate 100. It is permissible if the protective film 109 has structure for covering parts repeatedly used for the formation of the semiconductor functional layer 120. For example, the protective film 109 is desired to cover at least a back surface 101*b* of the substrate 101 different from a formation surface 101*a* on which the semiconductor laminated body 110 is formed, a side face 101*c* of the substrate 101, and a side face 110*c* of the semiconductor laminated body 110 on the substrate unit 1. In other words, the substrate unit 1 with the protective film 109 formed from the back surface 101*b* to a side face of a buffer layer 104 (shown in FIG. 4 to FIG. 9 described later) is also permissible. With such a substrate unit 1, the substrate 101 and a buffer layer 102 are never eroded in the etching processes after the formation and the separation of the semiconductor functional layer 120 and it becomes possible to repeatedly reuse the substrate 101 and the buffer layer 102 (shown in FIG. 4 to FIG. 16 described later).

(1-2) Details of First Embodiment

<Manufacture of Substrate Unit>

FIG. 2 is a flowchart showing a manufacturing method of the substrate unit according to the first embodiment. FIG. 3, FIG. 4, and FIG. 5 are schematic cross-sectional views showing a manufacturing process (part 1, part 2 and part 3) of the substrate unit according to the first embodiment.

As shown in FIG. 3 and FIG. 4, in the manufacturing method of the substrate unit according to the first embodiment, the semiconductor laminated body 110 is grown on the substrate 101 as a semiconductor substrate by epitaxial growth (step S101 in FIG. 2), the sacrificial layer 105 is grown on the semiconductor laminated body 110 (step S102 in FIG. 2), and the semiconductor functional layer 120 is grown on the sacrificial layer 105 (step S103 in FIG. 2). The substrate 101 is an indium phosphide (InP) substrate, for example.

As shown in FIG. 4, the semiconductor laminated body 110 grown on the substrate 101 includes a buffer layer 102 as a first layer made with InP, an etching stop layer 103 as a second layer made with indium gallium arsenide (InGaAs) formed on the buffer layer 102, a buffer layer 104 as a third layer made with InP formed on the etching stop layer 103, and the sacrificial layer 105 made with indium gallium arsenide (InGaAs). The sacrificial layer 105 may be a single layer made with only InGaAs. Alternatively, the sacrificial layer 105 may be a multilayer structure formed with layers of multiple materials which include a layer made with InGaAs and another layer made with indium gallium arsenide phosphide (InGaAsP). Hydrochloric acid is used as an etchant material for the buffer layer 104 as a first etchant material, and a liquid mixture of phosphoric acid and a hydrogen peroxide solution, a liquid mixture of citric acid and a hydrogen peroxide solution, or a liquid mixture of sulfuric acid and a hydrogen peroxide solution is used as an etchant material for the etching stop layer 103 as a second etchant material. Also, for the sacrificial layer 105, a liquid mixture of phosphoric acid and a hydrogen peroxide solution, a liquid mixture of citric acid and a hydrogen peroxide solution, or a liquid mixture of sulfuric acid and a hydrogen peroxide solution is used.

By forming the buffer layer 102 with the same material as the substrate 101, the total thickness of the substrate 101 and the buffer layer 102 can be increased. Further, providing the buffer layer 102 makes it possible not to reduce the thickness of the substrate 101 also when removing upper layers in a reuse (i.e., recycling) process which will be described later. The etching stop layer 103 may also be formed with a different material such as aluminum gallium arsenide (AlGaAs). The semiconductor laminated body 110 is not limited to that having the configuration shown in FIG. 4.

As shown in FIG. 4, the semiconductor functional layer 120 grown on the sacrificial layer 105 includes an n-type cladding layer 106 made with InP, an active layer 107 as an InGaAs photoabsorption layer, and a p-type cladding layer 108 made with InP. In the first embodiment, the n-type cladding layer 106 and the p-type cladding layer 108 are formed with the same material as the substrate 101.

Subsequently, as shown in FIG. 5, the protective film 109 covering the whole of the multilayer substrate 100 is formed (step S104 in FIG. 2). The protective film 109 is formed with organic metallic material, for example. The protective film 109 is formed by means of ALD (Atomic Layer Deposition), for example. The protective film 109 may also be formed by a different method such as CVD (Chemical Vapor Deposition). The protective film 109 is formed to cover at least the back surface 101*b* of the substrate 101 opposite to the semiconductor laminated body 110, the side face 101*c* of the substrate 101, and the side face 110*c* of the semiconductor laminated body 110, as parts reused for the formation of the semiconductor functional layer 120. When ALD is used, the film thickness of the protective film 109 can be uniformalized.

Subsequently, when alumina as an oxidized film of aluminum is deposited as the protective film 109 on the entire periphery of the multilayer substrate 100 by the ALD processing, if trimethylaluminum (TMA) is poured to flow on a planar material, TMA covers the surface of the planar material; however, TMA is not stacked further after the entire surface is covered with one layer of TMA. At this point, if nitrogen is poured, surplus TMA can be removed, and if water or ozone is poured next, methyl groups of TMA are separated, aluminum is oxidized, and one layer of alumina film is formed.

Subsequently, remaining water and ozone are removed and thereafter TMA is supplied again. By repeating this operation, a plurality of atomic layers of alumina are deposited. While trimethylaluminum is used in the first embodiment, it is also possible to use a different organic metal such as $(CH_3)_3Ga$ (trimethylgallium) or the like, for example.

The protective film 109 can also be a resist or the like as a different organic protective film.

<Peeling of Semiconductor Functional Layer>

FIGS. 6A and 6B, FIGS. 7A and 7B and FIGS. 8A and 8B are schematic cross-sectional views and schematic plan views showing a peeling process (part 1, part 2 and part 3) of a semiconductor functional layer 120. FIG. 9 is a schematic cross-sectional view showing the peeling process (part 4) of the semiconductor functional layer. While the plan-view shape of the substrate 101 is shown as a square shape in these drawings, the plan-view shape is not limited to the illustrated example.

Subsequently, the semiconductor functional layer 120 and the sacrificial layer 105 are patterned by means of dry etching as shown in FIGS. 6A and 6B, and the p-type cladding layer 108 made with InP and the active layer 107 made with InGaAs are patterned by means of dry etching as shown in FIGS. 7A and 7B (step S105 in FIG. 2).

Subsequently, as shown in FIGS. 8A and 8B, a functional layer protective film 121 is formed to cover the side face of the active layer 107 and the upper surface and the side face of the p-type cladding layer 108 (step S106 in FIG. 2). The functional layer protective film 121 is formed with $Al_2O_3$, $Si_3N_4$, $SiO_2$ or the like, for example.

Subsequently, as shown in FIG. 9, the sacrificial layer 105 is etched by using an etchant material for wet etching, and the semiconductor functional layer 120 is lifted by the moving device (not shown) and thereby separated (i.e., peeled off) from the semiconductor laminated body 110 (step S107 in FIG. 2). The peeled semiconductor functional layer 120 (e.g., an individual piece of the semiconductor functional layer 120) is stuck on (i.e., transferred onto) a desired mounting substrate (not shown), provided with wiring, and functions as a semiconductor element (e.g., a light emitting element, a light receiving element, a piezoelectric element, or the like).

<Reuse of Substrate Unit>

FIG. 10 to FIG. 13 are schematic cross-sectional views showing a reuse process (part 1 to part 4) of the substrate unit according to the first embodiment. While the plan-view shape of the substrate 101 is shown as a square shape in these drawings, the plan-view shape is not limited to the illustrated example.

After the semiconductor functional layer 120 is peeled off from the semiconductor laminated body 110, as shown in FIG. 10, the buffer layer 104 is wet etched until reaching a state in which the substrate 101, the buffer layer 102, the etching stop layer 103, and part of the protective film 109 remain unremoved. Subsequently, as shown in FIG. 11, the protective film 109 is etched. It is also possible to leave the protective film 109 unremoved in FIG. 11 and FIG. 12. Subsequently, as shown in FIG. 12, the etching stop layer 103 is wet etched. At that time, the exposed upper surface of the buffer layer 102 is in a rough condition with low smoothness, and thus processing for smoothing is executed by a polishing process (lapping) (step S108 in FIG. 2). FIG. 13 shows the multilayer substrate having the smoothed upper surface.

FIG. 14 and FIG. 15 are schematic cross-sectional views showing a machine polishing process (part 1 and part 2) of the substrate unit according to the first embodiment. FIG. 14 and FIG. 15 show a modification of the process shown in FIG. 10 to FIG. 12. That is, the process shown in FIG. 10 to FIG. 12 may be replaced with the machine polishing process by a polishing apparatus 150 shown in FIG. 14 and FIG. 15. As the machine polishing, CMP (Chemical Mechanical Polishing) is used, for example. By the machine polishing process shown in FIG. 14 and FIG. 15, the multilayer substrate having the smoothed upper surface is obtained.

FIG. 16 is a schematic cross-sectional view showing the reuse process (part 5) of the substrate unit according to the first embodiment. As shown in FIG. 16, a buffer layer (a surface projecting upward relative to the protective film 109) is additionally formed on the buffer layer 102 in FIG. 15, and the etching stop layer 103 and the buffer layer 104 as remaining layers of the semiconductor laminated body 110, the sacrificial layer 105, and the semiconductor functional layer 120 are successively grown (step S109 in FIG. 2). Alternatively, a buffer layer is additionally formed on the buffer layer 102 in FIG. 13, and subsequent layers are formed again as shown in FIG. 4.

Subsequently, the semiconductor functional layer 120 and the sacrificial layer 105 are patterned by means of dry etching as shown in FIGS. 6A and 6B, and the p-type cladding layer 108 made with InP and the active layer 107 made with InGaAs are patterned by means of dry etching as shown in FIGS. 7A and 7B (step S110 in FIG. 2).

Subsequently, as shown in FIGS. 8A and 8B, the functional layer protective film 121 is formed to cover the side face of the active layer 107 and the upper surface and the side face of the p-type cladding layer 108.

Subsequently, as shown in FIG. 9, the semiconductor functional layer 120 is peeled off from the semiconductor laminated body 110 (step S111 in FIG. 2).

In the reuse process of the substrate unit, the process from the step S108 to the step S111 (i.e., the process for forming the semiconductor functional layer) can be executed repeatedly. Further, in the reuse process, the substrate unit in FIG. 5 can be obtained again by executing the ALD processing.

(1-3) Effect of First Embodiment

As described above, with the manufacturing method or the substrate unit 1 in the first embodiment, the damage to the substrate 101 made with InP can be reduced thanks to the provision of the protective film 109. Further, it becomes possible to repeatedly reuse the substrate 101 and the buffer layer 102 in a state with no erosion of the buffer layer 102 made with InP. Therefore, the number of times of reusing the substrate 101 and the semiconductor laminated body 110 for growing the semiconductor functional layer 120 can be increased. Furthermore, in a case where the protective film 109 is formed after the semiconductor functional layer 120 is formed, the damage to the substrate 101 during the etching of the sacrificial layer 105 can be further reduced and the number of times of the reusing can be further increased.

(2) SECOND EMBODIMENT (2-1) General Outline of Second Embodiment

FIG. 17 is a schematic diagram showing a multilayer substrate as an original form of a substrate unit according to a second embodiment. FIG. 18 is a schematic diagram showing a cross section of the substrate unit 2 according to the second embodiment. The substrate unit 2 in FIG. 18 is used for growing a semiconductor functional layer 220 shown in FIG. 17. Alternatively, the substrate unit 2 in FIG. 18 is formed by reusing a substrate 201 and a semiconductor laminated body 210 after peeling off the semiconductor functional layer 220 in FIG. 17.

The substrate unit 2 includes a multilayer substrate 200 including a plurality of semiconductor layers stacked up and a protective film 209 covering the whole of the multilayer substrate 200. The multilayer substrate 200 includes the substrate 201 that is a semiconductor substrate (e.g., semiconductor wafer) and the semiconductor laminated body 210 provided on the substrate 201.

The semiconductor laminated body 210 includes one or a plurality of semiconductor layers formed on the substrate 201 by epitaxial growth as crystal growth. A concrete example of the semiconductor laminated body 210 will be described later.

A sacrificial layer 205 shown in FIG. 17 is a semiconductor layer formed on the semiconductor laminated body 210 by epitaxial growth as crystal growth. The sacrificial layer 205 is formed with a material that is easily etched by the etchant material used (i.e., that has a higher etching speed than other layers). A concrete example of the sacrificial layer 205 will be described later.

The semiconductor functional layer 220 shown in FIG. 17 is a semiconductor layer in which semiconductor elements are to be formed. Similarly to the case in the first embodiment, the semiconductor functional layer 220 is split and two-dimensionally arranged on a semiconductor wafer by processing. By etching the sacrificial layer 205, each of the plurality of semiconductor elements (i.e., each of the plurality of split semiconductor functional layers 220) can be separated (i.e., peeled off) from the semiconductor laminated body 210. Each of the semiconductor functional layers 220 has a function as a semiconductor device (e.g., a light source, an optical detector, an image sensor, or the like) or a semiconductor element (e.g., a light emitting element, a light receiving element, a piezoelectric element, or the like). The separated semiconductor functional layer 220 is lifted and conveyed by the moving device (not shown) and is stuck on a mounting substrate (not shown) by intermolecular force, for example. A concrete example of the semiconductor functional layer 220 will be described later.

While the protective film 209 covers the whole of the multilayer substrate 200 in FIG. 18, the protective film 209 does not necessarily need to cover the whole of the multilayer substrate 200. It is permissible if the protective film 209 has structure for covering parts repeatedly used for the formation of the semiconductor functional layer 220. For example, the protective film 209 is desired to cover at least a back surface 201*b* of the substrate 201 from a formation surface 201*a* on which the semiconductor laminated body 210 is formed, a side face 201*c* of the substrate 201, and a side face 210*c* of the semiconductor laminated body 210 on the substrate unit 2.

(2-2) Details of Second Embodiment

<Manufacture of Substrate Unit>

FIG. 19 is a flowchart showing a manufacturing method of the substrate unit according to the second embodiment. FIG. 20 and FIG. 21 are schematic cross-sectional views showing a manufacturing process (part 1 and part 2) of the substrate unit according to the second embodiment.

As shown in FIG. 20 and FIG. 21, in the manufacturing method of the substrate unit according to the second embodiment, the semiconductor laminated body 210 is grown on the substrate 201 as the semiconductor substrate by epitaxial growth, the sacrificial layer 205 is grown on the semiconductor laminated body 210, and the semiconductor functional layer 220 is grown on the sacrificial layer 205 (step S201 in FIG. 19). The substrate 201 is an InP substrate, for example. Similarly to the case in the first embodiment, the sacrificial layer 105 may be a single layer made with only InGaAs. Alternatively, the sacrificial layer 105 may be a multilayer structure formed with layers of multiple materials which include a layer made with InGaAs and another layer made with InGaAsP.

As shown in FIG. 21, the semiconductor laminated body 210 grown on the substrate 201 includes a buffer layer 202 as a first layer made with InP, an etching stop layer 203 as a second layer made with InGaAs formed on the buffer layer 202, and a buffer layer 204 as a third layer made with InP formed on the etching stop layer 203.

By forming the buffer layer 202 with the same material as the substrate 201, the total thickness of the substrate 201 and the buffer layer 202 can be increased. Further, providing the buffer layer 202 makes it possible not to reduce the thickness of the substrate 201 also when removing upper layers in a reuse process which will be described later. The etching stop layer 203 may also be formed with a different material such as InGaAsP. The semiconductor laminated body 210 is not limited to that having the configuration shown in FIG. 21. In the second embodiment, it is desirable that the sacrificial layer 205 be made with InGaAs and the etching stop layer 203 be made with InGaAsP. This lowers the etching selectivity ratio of the etching stop layer 203 to the sacrificial layer 205, thus reducing the damage to the etching stop layer 203 when the sacrificial layer 205 is removed.

As shown in FIG. 21, the semiconductor functional layer 220 grown on the sacrificial layer 205 includes an n-type cladding layer 206 made with InP, an active layer 207 as an InGaAs photoabsorption layer, and a p-type cladding layer 208 made with InP. In the second embodiment, the n-type cladding layer 206 and the p-type cladding layer 208 are formed with the same material as the substrate 201.

FIGS. 22A and 22B, FIGS. 23A and 23B and FIGS. 24A and 24B are schematic cross-sectional views and schematic plan views showing the manufacturing process (part 3, part 4 and part 5) of the substrate unit according to the second embodiment. While the plan-view shape of the substrate 201 is shown as a square shape in these drawings, the plan-view shape is not limited to the illustrated example.

Subsequently, the semiconductor functional layer 220 and the sacrificial layer 105 are patterned by means of dry etching as shown in FIGS. 22A and 22B, and the p-type cladding layer 208 made with InP and the active layer 207 made with InGaAs are patterned by means of dry etching as shown in FIGS. 23A and 23B (step S202 in FIG. 19).

Subsequently, as shown in FIGS. 24A and 24B, a functional layer protective film 221 is formed to cover the side face of the active layer 207 and the upper surface and the side face of the p-type cladding layer 208. The functional layer protective film 221 is formed with $Al_2O_3$, $Si_3N_4$, $SiO_2$ or the like, for example.

FIG. 25 is a schematic cross-sectional view showing the manufacturing process (part 7) of the substrate unit according to the second embodiment. As shown in FIG. 25, the sacrificial layer 205 is etched by using an etchant material for wet etching, and the semiconductor functional layer 220 is lifted by the moving device (not shown) and thereby separated (i.e., peeled off) from the semiconductor laminated body 210 (step S203 in FIG. 19). The peeled semiconductor functional layer 220 (e.g., an individual piece of the semiconductor functional layer 220) is stuck on (i.e., transferred onto) a desired mounting substrate (not shown), provided with wiring, and functions as a semiconductor element (e.g., a light emitting element, a light receiving element, a piezoelectric element, or the like).

FIG. 26 is a schematic cross-sectional view showing the manufacturing process (part 8) of the substrate unit according to the second embodiment. As shown in FIG. 26, the protective film 209 covering the whole of the multilayer substrate 200 made up of the substrate 201 and the semiconductor laminated body 210 is formed (step S204 in FIG. 19). The protective film 209 is formed with organic metallic material, for example. The protective film 209 is formed by means of ALD, for example. The protective film 209 may also be formed by a different method such as CVD. The protective film 209 does not necessarily need to cover the whole of the multilayer substrate 200. The protective film 209 is formed to cover at least the back surface 201*b* of the substrate 201 opposite to the semiconductor laminated body 210, the side face 201*c* of the substrate 201, and the side face 210*c* of the semiconductor laminated body 210, as parts reused for the formation of the semiconductor functional layer 220. The protective film 209 is the same as the protective film in the first embodiment.

<Reuse of Substrate Unit>

FIG. 27 to FIG. 31 are schematic cross-sectional views showing a reuse process (part 1 to part 5) of the substrate unit according to the second embodiment.

After the semiconductor functional layer 220 is peeled off from the semiconductor laminated body 210, as shown in FIG. 27 and FIG. 28, the buffer layer 204 is wet etched until reaching a state in which the substrate 201, the buffer layer 202, the etching stop layer 203, and part of the protective film 209 remain unremoved. Subsequently, as shown in FIG. 29, the protective film 209 is etched. It is also possible to leave the protective film 209 unremoved in FIG. 29. Subsequently, as shown in FIG. 30, the etching stop layer 203 is wet etched. At that time, the exposed upper surface of the buffer layer 202 is in a rough condition with low smoothness, and thus processing for smoothing is executed by a polishing process (lapping) (step S205 in FIG. 19). FIG. 31 shows the multilayer substrate having the smoothed upper surface. It is also possible to use CMP for the smoothing process similarly to the case in the first embodiment.

FIG. 32 is a schematic cross-sectional view showing the reuse process (part 6) of the substrate unit according to the second embodiment. As shown in FIG. 32, the multilayer substrate 200 is formed by successively growing the etching stop layer 203 and the buffer layer 204, as the remaining layers of the semiconductor laminated body 210, on the buffer layer 202 in FIG. 31 (step S206 in FIG. 19).

Subsequently, as shown in FIG. 26, the protective film 209 covering the whole of the multilayer substrate 200 is formed (step S207 in FIG. 19). The protective film 209 is formed to cover at least the back surface 201*b* of the substrate 201 opposite to the semiconductor laminated body 210, the side face 201*c* of the substrate 201, and the side face 210*c* of the semiconductor laminated body 210, as parts reused for the formation of the semiconductor functional layer 220. The substrate unit 2 shown in FIG. 26 is formed by this process.

(2-3) Effect of Second Embodiment

As described above, with the manufacturing method or the substrate unit 2 in the second embodiment, thanks to the provision of the protective film 209, it becomes possible to repeatedly reuse the substrate 201 and the buffer layer 202 in a state with absolutely no erosion of not only the substrate 201 made with InP but also the buffer layer 202 made with InP. Therefore, the number of times of reusing the substrate 201 and the semiconductor laminated body 210 for growing the semiconductor functional layer 220 can be increased. Furthermore, since the protective film 109 is formed after the process of separating the semiconductor functional layer 220 from the semiconductor laminated body 210, it is possible to reduce the occurrence of scratches on the protective film 209 that may occur during the process of the separating. Therefore, in the process of reusing the substrate unit, it is possible to prevent the etching solution (i.e., etchant) from entering through the scratches in the protective film 209, thereby improving the yield in reuse.

(3) MODIFICATION 1

While an example is shown about the semiconductor functional layer 120, 220 grown as the upper layer over the substrate 101, 201 as the basis of the growth, the semiconductor laminated body 110, 210 and the sacrificial layer 105, 205 in each of the above first and second embodiments, the semiconductor laminated body 110, 210 may be provided with an additional layer, the sacrificial layer 105, 205 may be provided with an additional layer, and the semiconductor functional layer 120, 220 may be provided with an additional upper layer. Further, while the semiconductor laminated body 110 (210) is formed with the buffer layer 102 (202), the etching stop layer 103 (203) and the buffer layer 104 (204), the semiconductor laminated body 110 (210) may also be formed with only one layer. For example, the semiconductor laminated body may be formed with only the buffer layer 104 (204).

While examples of forming the multilayer substrate 100, 200 by using InP-based materials are described in the above first and second embodiments, the multilayer substrate 100, 200 may also be formed by using GaAs-based materials or GaN-based materials. For example, it is possible to use GaAs as the material of the substrate 101, 201, use GaAs as the material of the buffer layer 102, 202, use InGaP as the material of the etching stop layer 103, 203, use AlGaAs or GaAs as the material of the buffer layer 104, 204, and use AlAs as the material of the sacrificial layer 105, 205.

(4) MODIFICATION 2

In the first embodiment described above, the semiconductor laminated body 110 includes the buffer layer 102, the etching stop layer 103 as an InGaAs layer formed on the buffer layer 102, and the buffer layer 104 as an InP layer formed on the etching stop layer 103; the sacrificial layer 105 as an InGaAs layer; and the semiconductor functional layer 101 including the n-type cladding layer 106 as an InP layer formed on the sacrificial layer 105, the active layer (AC) 107, and the p-type cladding layer 108 as an InGaAs layer. However, as shown in FIG. 33, it is possible to manufacture a substrate unit according to the modification 2 by using a multilayer substrate 1100 that includes a semiconductor laminated body 1110 including a buffer layer 1102 made of InP and an etching stop layer 1103 made of InGaAs; a sacrificial layer 1105 made of InP; and a semiconductor functional layer 1120 including an n-type cladding layer 1106 made of InGaAs, an active layer (AC) 1107, and a p-type cladding layer 1108 made of InGaAs.

In the modification 2, after the semiconductor laminated body 1110, the sacrificial layer 1105, and the semiconductor functional layer 1120 are stacked on a substrate 1101 in this order, a protective film 1109 is formed. The materials, shape, and formation method of the protective film 1109 are substantially the same as those of the protective film 109 in the first embodiment. In subsequent steps, the sacrificial layer 1105 is removed and the semiconductor functional layer 1120 is separated from the semiconductor laminated body 1110, as in the first or second embodiment. Thereafter, similarly to the case shown in FIGS. 14 and 15, the etching stop layer 1103 is removed by polishing by CMP and an upper surface of the buffer layer 1102 is smoothed, thereby obtaining the substrate unit that includes the substrate 1101, the buffer layer 1102 having a smoothed upper surface and formed on the substrate 1101, and the protective film 1109 configured to cover from a back surface 1101*b* and a side face 1101*c* of the substrate 1101 to a side face 1102*c* of the buffer layer 1102 (the side faces 1101*c* and 1102*c* forms a side face of the semiconductor laminated body 1110).

In this way, even when the substrate 1101 and the sacrificial layer 1105 are made of the same material (for example, InP), since the protective film 1109 is formed after the semiconductor functional layer 1120 is formed and before the sacrificial layer 105 is removed, the back surface 1101*b* and the side face 1101*c* of the substrate 1101 and the side face 1102*c* of the buffer layer 1102 (the side faces 1101*c* and 1102*c* forms a side face of the semiconductor laminated body 1110) are protected from the damage caused by the etchant used to remove the sacrificial layer 1105.

Further, it is possible to form the multilayer substrate 1100 of the modification 2 using GaAs-based materials or GaN-based materials as in the modification 1.

(5) DESCRIPTION OF REFERENCE CHARACTERS

1, 2: substrate unit, 100, 200, 1100: multilayer substrate, 101, 201, 1101: substrate, 101*a*, 201*a*: formation surface, 101*b*, 201*b*, 1101*b*: back surface, 101*c*, 201*c*, 1101*c*: side face of substrate, 102, 202, 1102: buffer layer (first layer), 1102*c*: side face of buffer layer, 103, 203, 1103: etching stop layer (second layer), 104, 204: buffer layer (third layer), 105, 205, 1105: sacrificial layer, 106, 206, 1106: n-type cladding layer, 107, 207, 1107: active layer, 108, 208, 1108: p-type cladding layer, 109, 209, 1109: protective film, 110, 210, 1110: semiconductor laminated body, 110*c*, 210*c*: side face of semiconductor laminated body, 120, 220: semiconductor functional layer.

What is claimed is:

1. A substrate unit comprising: a substrate; a semiconductor laminated body formed directly on the substrate; a protective film that covers and prevents damage to at least a back surface of the substrate different from a formation surface on which the semiconductor laminated body is formed, a side face of the substrate, and a side face of the semiconductor laminated body; a sacrificial layer formed on the semiconductor laminated body, the sacrificial layer being made with a material that is etchable by an etchant material; and a semiconductor functional layer that is formed on the sacrificial layer, the semiconductor functional layer being a semiconductor layer in which a semiconductor element is to be formed.

2. The substrate unit according to claim 1, wherein the protective film covers an entire periphery of the substrate and the semiconductor laminated body.

3. The substrate unit according to claim 1, wherein the protective film covers an entire periphery of the substrate, the semiconductor laminated body, the sacrificial layer, and the semiconductor functional layer.

4. The substrate unit according to claim 1, wherein the semiconductor laminated body is a buffer layer formed with a same material as the substrate.

* * * * *